United States Patent
Tsutsui et al.

(10) Patent No.: US 8,270,537 B2
(45) Date of Patent: Sep. 18, 2012

(54) ANTENNA DEVICE, DEMODULATING DEVICE AND RECEIVING DEVICE

(75) Inventors: Kohichi Tsutsui, Kobe (JP); Susumu Hasegawa, Kobe (JP); Kazuo Takayama, Kobe (JP); Kenji Kawai, Kobe (JP); Mansaku Nakano, Kobe (JP); Eri Miyoshi, Kobe (JP)

(73) Assignee: Fujitsu Ten Limited, Kobe (JP)

( * ) Notice: Subject to any disclaimer, the term of this patent is extended or adjusted under 35 U.S.C. 154(b) by 503 days.

(21) Appl. No.: 12/409,189

(22) Filed: Mar. 23, 2009

(65) Prior Publication Data
US 2009/0245425 A1    Oct. 1, 2009

(30) Foreign Application Priority Data

Mar. 26, 2008 (JP) .................. 2008-081036
Mar. 27, 2008 (JP) .................. 2008-084390
Mar. 31, 2008 (JP) .................. 2008-090858

(51) Int. Cl.
*H04L 25/06* (2006.01)
*H04L 25/10* (2006.01)
(52) U.S. Cl. ................... 375/319; 343/745
(58) Field of Classification Search ............. 375/319; 343/745
See application file for complete search history.

(56) References Cited

U.S. PATENT DOCUMENTS
7,853,232 B2 * 12/2010 Noro .............................. 455/293

FOREIGN PATENT DOCUMENTS

| JP | A-03-130630 | 6/1991 |
|----|----|----|
| JP | A-03-254206 | 11/1991 |
| JP | A-04-298122 | 10/1992 |
| JP | A-10-075191 | 3/1998 |
| JP | A-2000-326899 | 11/2000 |
| JP | A-2001-177428 | 6/2001 |
| JP | A-2003-289260 | 10/2003 |

OTHER PUBLICATIONS

Japanese Office Action mailed May 22, 2012 in Japanese Patent Application No. 2008-081036 (with partial translation).
Japanese Office Action mailed May 22, 2012 in Japanese Patent Application No. 2008-084390 (with partial translation).
Japanese Office Action mailed May 22, 2012 in Japanese Patent Application No. 2008-090858 (with partial translation).

* cited by examiner

*Primary Examiner* — Shuwang Liu
*Assistant Examiner* — Nader Bolourchi
(74) *Attorney, Agent, or Firm* — Oliff & Berridge, PLC

(57) ABSTRACT

An antenna device that is placed adjacent to an antenna 5 for receiving a high frequency signal and includes an impedance matching circuit 6 and an amplifying circuit 21 to which a DC control voltage is supplied from a demodulating device 3 through a feeder cable 4 for transmitting the high frequency signal to the demodulating device 3, wherein the DC control voltage is set to a value for adjusting a frequency characteristic of the impedance matching circuit 6 within an allowable range corresponding to a received frequency. A small and inexpensive antenna device having a simple circuit configuration and good reception sensitivity is implemented.

16 Claims, 25 Drawing Sheets

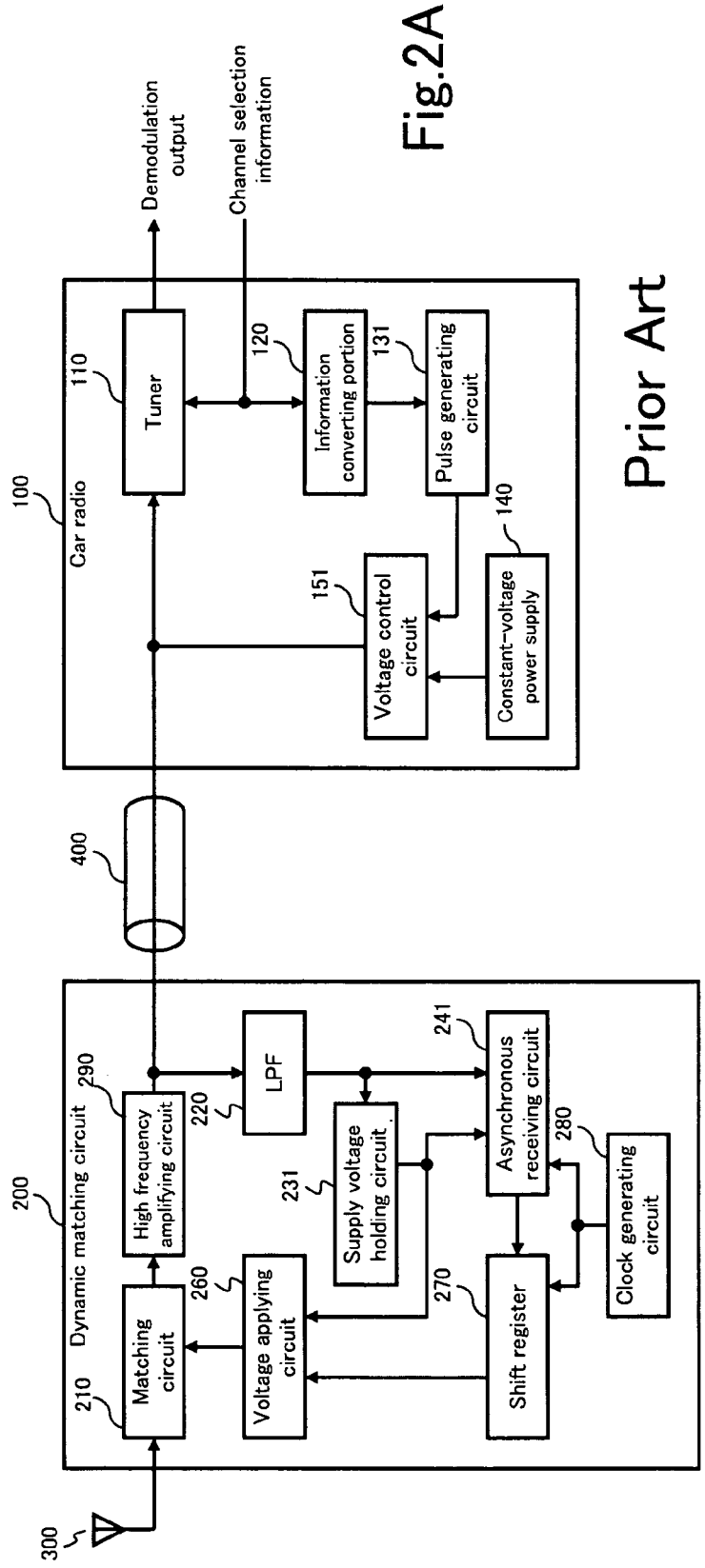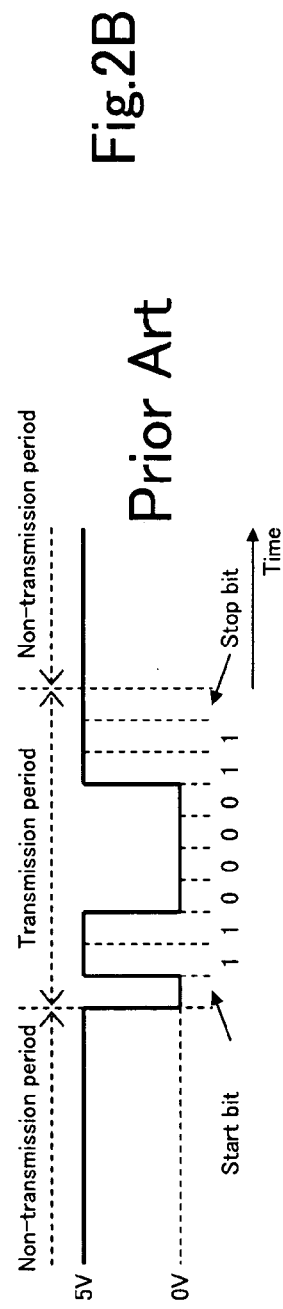

| Setting Table | | |
|---|---|---|
| CH | Frequency (MHz) | DA converter output voltage |
| 13 | 473 | 1.5 |
| 14 | 479 | 1.7 |
| 15 | 485 | 1.9 |
| 16 | 491 | 2.0 |
| ⋮ | ⋮ | ⋮ |
| 59 | 749 | 2.9 |
| 60 | 755 | 2.9 |
| 61 | 761 | 3.0 |
| 62 | 767 | 3.0 |

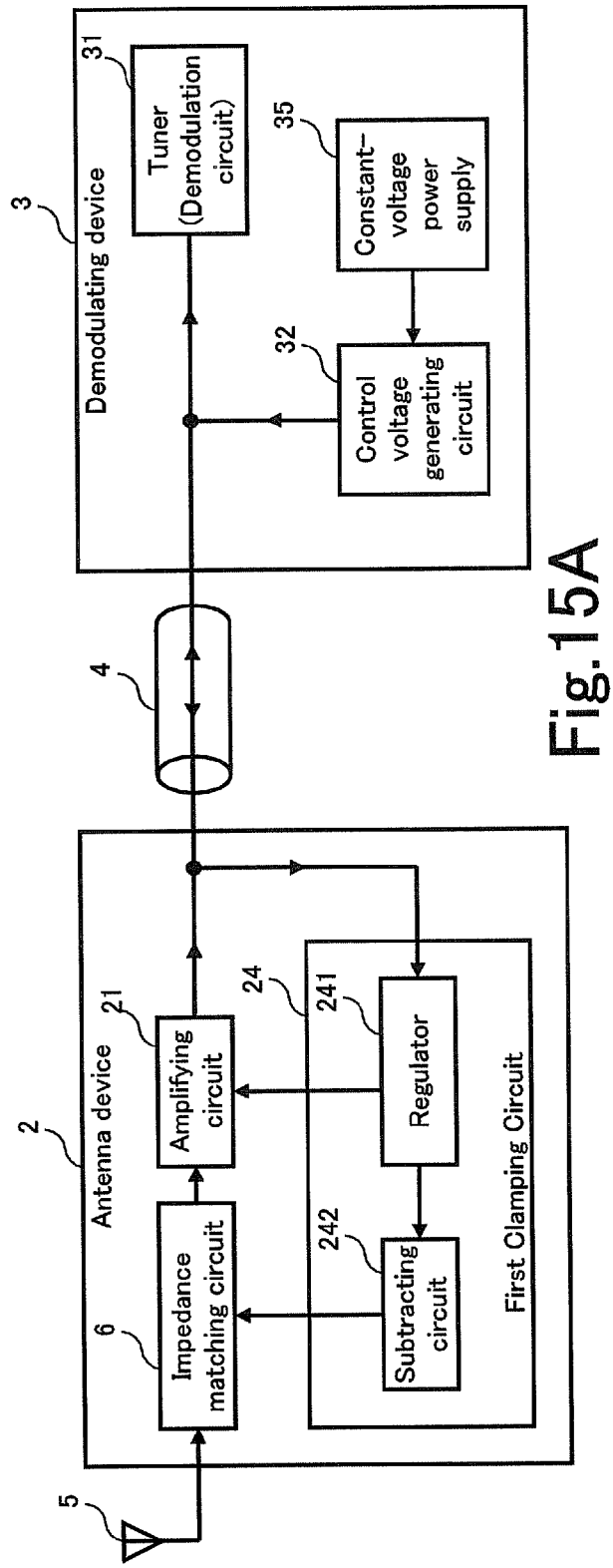
Fig.15A
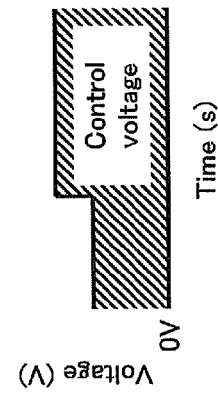
Fig.15D
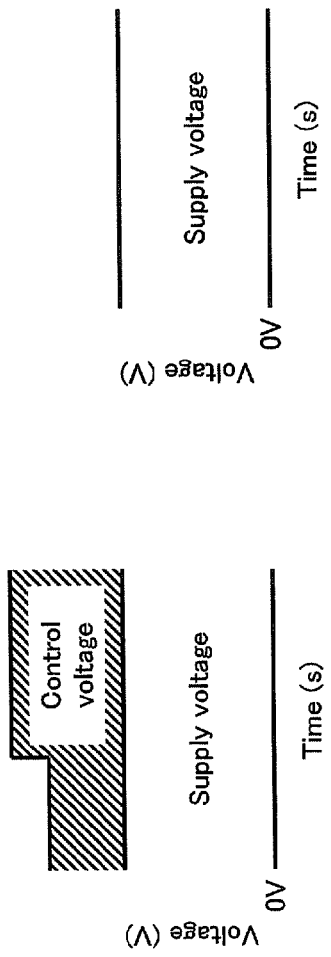
Fig.15C
Fig.15B

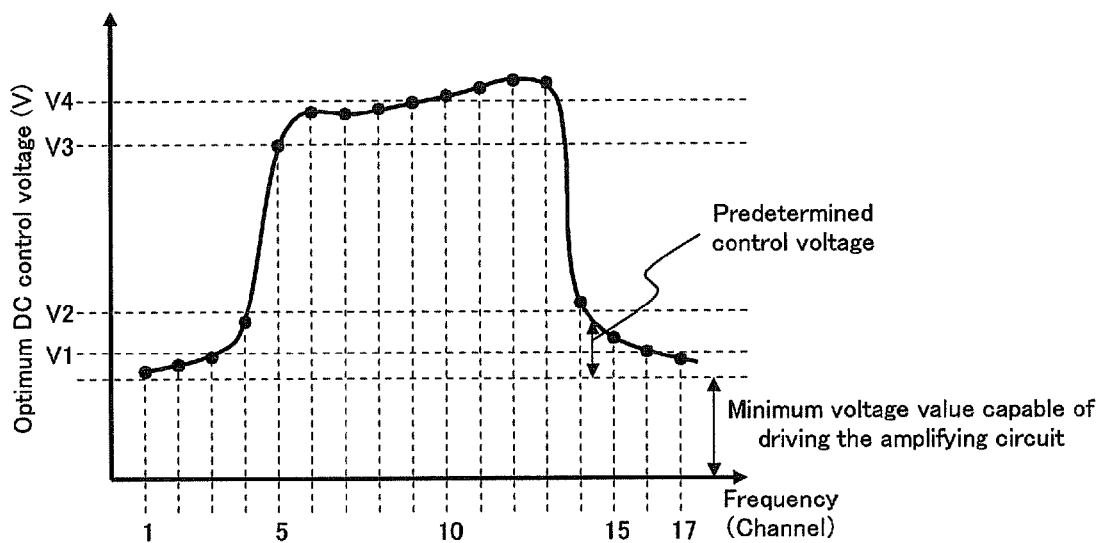
Fig.22A
Fig.22B
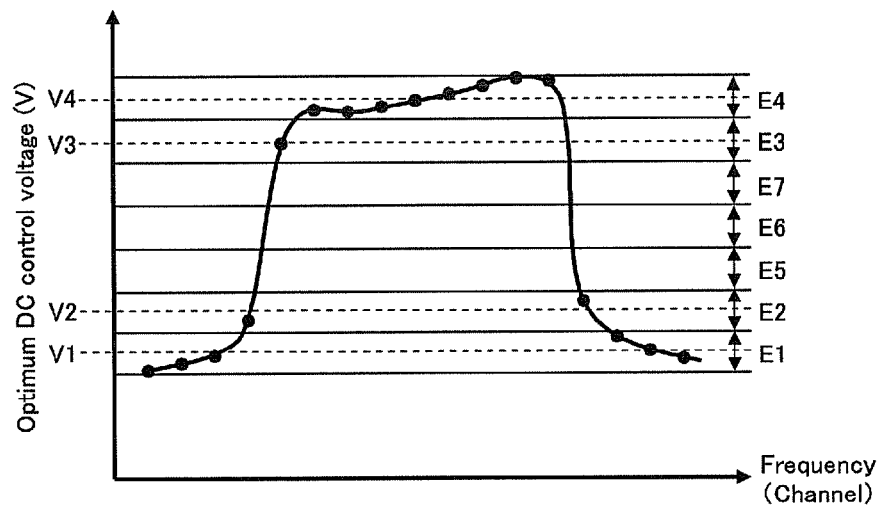
Fig.22C

ANTENNA DEVICE, DEMODULATING DEVICE AND RECEIVING DEVICE

This application is based on applications Nos. 2008-081036, 2008-084390 and 2008-090858 filed in Japan, the contents of which are hereby incorporated by reference.

BACKGROUND OF THE INVENTION

1. Field of the Invention

The present invention relates to an antenna device, a demodulating device, and a receiving device.

2. Description of the Related Art

When an antenna for receiving broadcasting waves of AM (Amplitude Modulation), FM (frequency Modulation), digital TV, and the like is connected through a feeder cable to a receiving device for processing high frequency signals received by the antenna, the longer the feeder cable is, the more power loss becomes.

In an on-board digital TV receiving system, for example, since a film antenna, which is a transparent film on which a conductor of an antenna element is printed, is attached to a windshield glass or a rear window glass while a receiving device is installed in a center console or the like that is distantly positioned from the windshield glass or the rear window glass, the length of the feeder cable increases.

Thus, in many cases, in order to make up for the power loss by a long feeder cable, such a configuration is employed that an antenna device having a small high-frequency amplifier mounted in a power feeding portion of an antenna is installed and the antenna device is connected through a feeder cable to a demodulating device or the like installed in the center console or the like.

However, since impedance at a power feeding point of the antenna, that is, output impedance of the antenna widely varies depending on received frequencies, impedances of the antenna and of the high-frequency amplifier must be matched.

Such impedance variations become pronounced in the cases of a large ratio bandwidth of broadcasting wave, such as in the case of digital TV broadcasting, the bandwidth of which is 470 to 770 MHz.

However, in order to match impedance, an impedance-matching circuit needs to be included in the antenna device and a control signal for impedance matching needs to be transmitted from the demodulating device to the impedance-matching circuit. This necessitates a control line between the antenna device and the demodulating device in addition to the feeder cable. This results in a higher cost due to increased wiring and involves troublesome installation work.

In order to solve such a problem, Japanese Patent Application Publication No. 4-298122 discloses a vehicle antenna device that includes an antenna provided on a window glass of a vehicle, a dynamic matching circuit connected to the antenna, and a car radio connected to the dynamic matching circuit through a transmission cable, and that can perform impedance matching in a preferable manner.

The dynamic matching circuit includes at least two variable-capacitance diodes and a voltage application circuit for separately applying a voltage to each of the variable-capacitance diodes on the basis of a frequency selection signal of the car radio.

The vehicle antenna device is configured to superpose a received high frequency signal to be transmitted from the dynamic matching circuit to the car radio, the frequency selection signal to be transmitted from the car radio to the dynamic matching circuit, and a supply voltage to be transmitted from the car radio to the dynamic matching circuit onto one transmission cable and then transmit them.

In addition, as a method for encoding a frequency selection signal and transmitting it from a car radio to a dynamic matching circuit, Japanese Patent Application Publication No. 4-298122 discloses two kinds of methods.

A first method is a method for adding a voltage level corresponding to a frequency selection signal to a supply voltage and transmitting them.

FIG. 1 shows a configuration example of a vehicle antenna device based on the first method. A car radio 100 includes a tuner 110, an information converting portion 120 that is tuned to channel selection information (selection frequency) of FM broadcast band at a 1 MHz pitch and outputs a frequency selection signal which is a digital signal, an DA converter 130 for converting the frequency selection signal into an analog signal, a voltage control circuit 150 for generating a frequency signal having the converted analog signal added to the supply voltage to be output from a constant-voltage power supply 140, and a low pass filter 160.

A dynamic matching circuit 200 includes a matching circuit 210 that is placed adjacent to an antenna 300 and performs impedance matching on the basis of a voltage to be applied to variable-capacitance diodes, a high frequency amplifying circuit 290 for amplifying a high frequency signal output from the matching circuit 210, a voltage fixing circuit 230 for reproducing a supply voltage from a frequency signal to be input through a low pass filter 220, a voltage subtracting circuit 240 for subtracting the supply voltage from the frequency signal and retrieving an analog signal, an AD converter 250 for converting the analog signal to a digital signal that is the frequency selection signal, and a voltage applying circuit 260 for separately applying a voltage to each variable-capacitance diode of the matching circuit 210 on the basis of the frequency selection signal.

A second method is a method for transmitting a pulse signal that switches a supply voltage to either high level or low level depending on a pulse train that is generated on the basis of a frequency selection signal.

FIG. 2A shows a configuration example of a vehicle antenna device according to the second method. Description will be made of respects different from the first method. The car radio 100 includes a pulse generating circuit 131 and a voltage control circuit 151 instead of the DA converter 130 and the voltage control circuit 150 in the first method.

The pulse generating circuit 131 generates pulse signals that are binarized on the basis of the frequency selection signals. The voltage control circuit 151 generates a pulse train of 0V or 5V corresponding to the level of the pulse signal (low level or high level).

The dynamic matching circuit 200 includes a supply voltage holding circuit 231, an asynchronous receiving circuit 241, a shift register 270, and a clock generating circuit 280, instead of the voltage fixing circuit 230, the voltage subtracting circuit 240, and the AD converter 250 in the first method.

The supply voltage holding circuit 231 is formed of a high-capacity condenser, a super capacitor, or the like to hold a supply voltage level even when a pulse of low level is input.

Referring to FIG. 2B, the asynchronous receiving circuit 241 recognizes a start bit to be transmitted when a transmission period starts, a data bit having a predetermined number of bits (8 bits in FIG. 2B), an end bit of the transmission period, and a stop bit to be transmitted during a non-transmission period, by synchronizing them to a clock signal to be transmitted from the clock generating circuit 280.

The shift register 270 holds, in a time series manner, a pulse train to be transmitted from the asynchronous receiving circuit 214. The clock generating circuit 280 supplies a clock signal to the asynchronous receiving circuit 241 and the shift register 270.

In both first and second methods, the car radio 100 and the dynamic matching circuit 200 are connected to one another through one transmission cable 400.

In the first method (configuration of FIG. 1) described above, since the dynamic matching circuit 200 must be provided with the voltage fixing circuit 230, the AD converter 250, the voltage applying circuit 260, and the like, the circuit size increases and thus the cost increases.

The second method (configuration of FIG. 2A) described above has three problems to be described below. A first problem is an adverse effect of the clock on the circuit portions constituting the antenna device.

In the second method, the dynamic matching circuit 200 must be provided with the dock generating circuit 280. Generally, since the size of the elements constituting the clock generating circuit 280 of low frequency increases, the clock generating circuit 280 is in many cases configured to use a crystal oscillator or a piezoelectric oscillator of high frequencies (e.g., approximately several tens of megahertz).

The dynamic matching circuit 200 is a circuit that is provided immediately under the antenna 300 and handles high frequency signals. Thus, when the dynamic matching circuit 200 is provided with a clock generating circuit 280 of high frequency, runaround of clock signals and the like may occur, which may cause adverse effects including superposition of noise on a high frequency signal received from the antenna 300.

A second problem is increased circuit size. The voltage control circuit 151 is configured to generate a pulse train only when the received condition of frequency changes while maintaining a voltage of 5V without formation of a pulse train and transmitting the voltage to the dynamic matching circuit 200 when the received condition does not change.

However, it is difficult to implement the asynchronous receiving circuit 241 that recognizes a pulse train, which is transmitted only when the received condition changes, by synchronizing the pulse train with a clock signal, and even if the asynchronous receiving circuit 241 could be implemented, the circuit size would grow and the cost might increase.

A third problem is a need for large-sized components. As described above, the voltage control circuit 151 generates a pulse train of 0V or 5V corresponding to the level of a pulse signal and transmits the pulse train to the dynamic matching circuit 200.

For example, when a communication rate between the car radio 100 and the dynamic matching circuit 200 is 300 bps and an 8-bits pulse signal of low level follows a 1-bit start bit, that is, 9 bits of low level continue, then voltage will not be supplied to the asynchronous receiving circuit 241, the voltage applying circuit 260, and the like for a period of 0.03 seconds on the basis of (Formula 1) shown below:

$$(8+1)/300=0.03 \quad \text{(Formula 1)}$$

However, there must not be any conditions where no voltage is supplied to the asynchronous receiving circuit 241 and the voltage applying circuit 260. Thus, although the supply voltage holding circuit 231 formed of the high-capacity condenser or the super capacitor is necessary, as described above, the element size of the high-capacity condenser or the super capacitor is large in general.

SUMMARY OF THE INVENTION

An antenna device according to the present invention is an antenna device that is placed adjacent to an antenna for receiving a high frequency signal, includes an impedance matching circuit and an amplifying circuit for amplifying an output from the impedance matching circuit, and transmits the high frequency signal output from the amplifying circuit to a demodulating device through a feeder cable, the antenna device characterized in that a DC control voltage that adjusts a frequency characteristic of the impedance matching circuit within an allowable range corresponding to a received frequency is supplied from the demodulating device through the feeder cable, and the impedance matching circuit and the amplifying circuit are driven on the basis of the DC control voltage.

A demodulating device according to the present invention is a demodulating device that demodulates a high frequency signal to be transmitted through a feeder cable from an antenna device placed adjacent to an antenna for receiving a high frequency signal, characterized in including a demodulation circuit for demodulating the high frequency signal transmitted from the antenna device through the feeder cable, and a control voltage generating circuit for generating a DC control voltage to be supplied to an impedance matching circuit and an amplifying circuit that are incorporated in the antenna device, the DC control voltage adjusting a frequency characteristic of the impedance matching circuit within an allowable range corresponding to a received frequency, and for outputting the generated DC control voltage to the feeder cable.

The other aspects of the invention will be apparent by referring to embodiments below.

BRIEF DESCRIPTION OF THE DRAWINGS

FIG. 2A is a block configuration diagram of a vehicle antenna device that sends a pulse train to a dynamic matching circuit; and FIG. 2B is a time chart for illustrating data transmission that uses an asynchronous receiving circuit.

FIG. 15A is a block configuration diagram of a sixth example of the antenna device; FIG. 15B is an illustration of a DC control voltage; FIG. 15C is an illustration of a supply voltage; and FIG. 15D is an illustration of a control voltage.

FIG. 22A is an illustration showing a setting table; FIG. 22B is a characteristic diagram of an optimum DC control voltage relative to a received frequency; and FIG. 22C is an illustration showing division of the optimum DC control voltage relative to the received frequency into a plurality of groups.

DESCRIPTION OF THE PREFERRED EMBODIMENTS

A receiving device will be described hereinafter wherein an antenna device and a demodulating device are incorporated into a vehicle and are connected to one another through a feeder cable.

A first embodiment will be described hereinafter.

Figure 3:
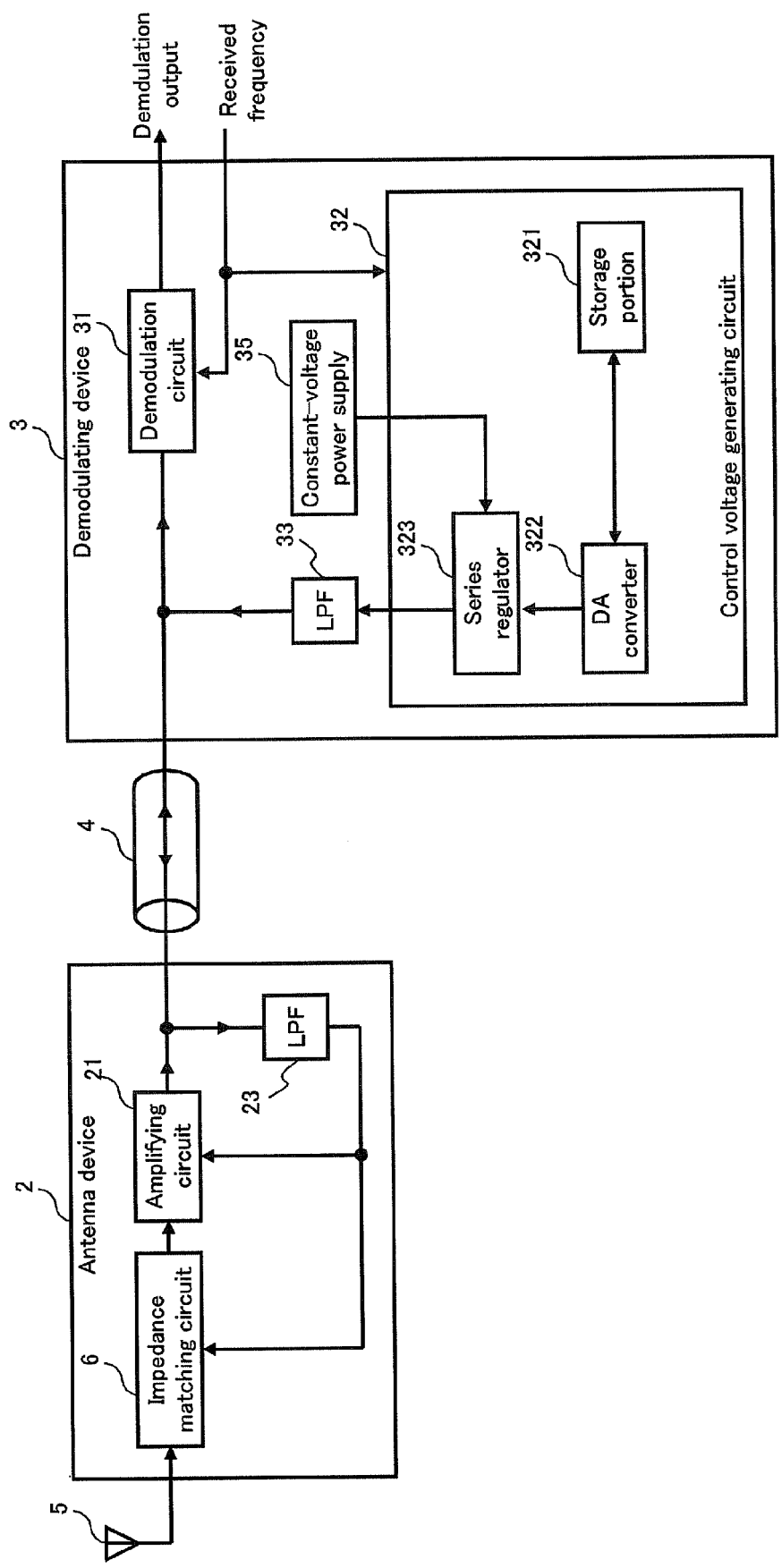
FIG. 3 is a block configuration diagram of a receiving device.

Referring to FIG. 3, in the receiving device, an antenna device 2 and a demodulating device 3 are connected through a feeder cable 4. The feeder cable 4 is formed of a single coaxial cable, for example. Then, a high frequency signal to be transmitted from the antenna device 2 to the demodulating device 3 and a DC control voltage to be transmitted from the demodulating device 3 to the antenna device 2 are transmitted through the coaxial cable.

The antenna device 2 is placed adjacent to an antenna 5 for receiving a high frequency signal; includes an impedance matching circuit 6, an amplifying circuit 21 for amplifying outputs of the impedance matching circuit 6, and a low pass filter 23; and transmits the high frequency signal output from the amplifying circuit 21 to the demodulating device 3 through the feeder cable 4. In this embodiment, the antenna 5 receives any of digital TV broadcasting waves, AM broadcasting waves, FM broadcasting waves, and the like.

Figure 6:
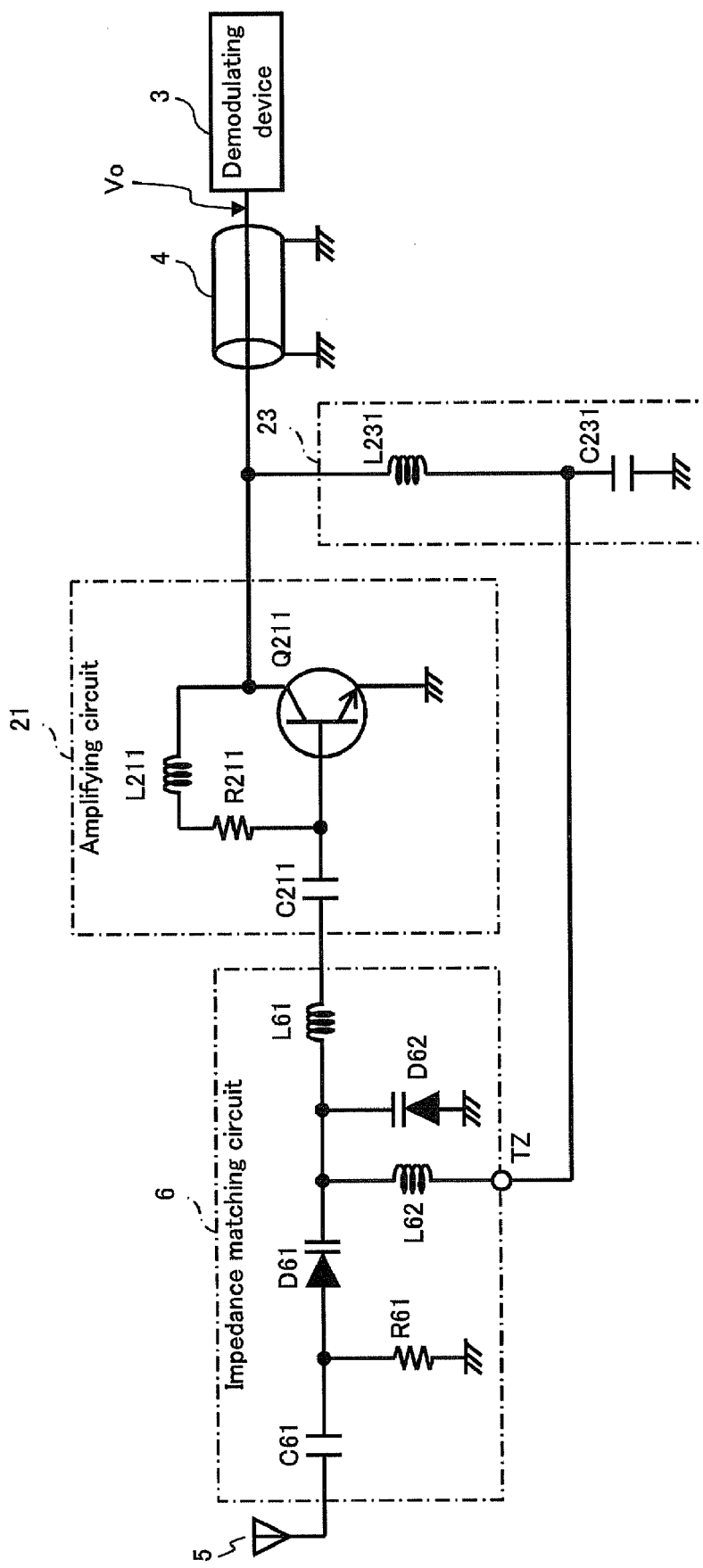
FIG. 6 is a circuit diagram of a first example of an antenna device.

FIG. 6 shows a circuit example of the antenna device 2. The impedance matching circuit 6 includes a capacitor C61 for removing DC components, a variable-capacitance diode D61, a resistor R61 for which a coil L61 is connected in series to the antenna 5 and that is connected in parallel to a node of the capacitor C61 and the variable-capacitance diode D61, a chalk coil L62 for removing a high frequency component connected in parallel to a node of the variable-capacitance diode D61 and the coil L61, and a variable-capacitance diode D62.

Impedances of the antenna 5 and the amplifying circuit 21 are matched by changing electrostatic capacity of the variable-capacitance diodes D61 and D62. In addition, in order to pass a small electric current through the variable-capacitance diode D61, the resistor R61 with a great resistance value is used.

The amplifying circuit 21 is formed of an npn type transistor Q211 in which a base is connected to the impedance matching circuit 6 through a capacitor C211 for removing DC components, a collector is connected to the demodulating device 3 through the feeder cable 4, and an emitter is grounded. A chalk coil L211 for removing high frequency components and a resistor R211 are connected in series between the base and the collector of the transistor Q211.

The low pass filter 23 including a capacitor C231 and a coil L231 removes a high frequency signal to be output from the amplifying circuit 21 to the demodulating device 3, and the DC control voltage transmitted from the demodulating device 3 to the antenna device 2 is supplied as a drive voltage for the amplifying circuit 21 and a control voltage for the impedance matching circuit 6.

Figure 4:
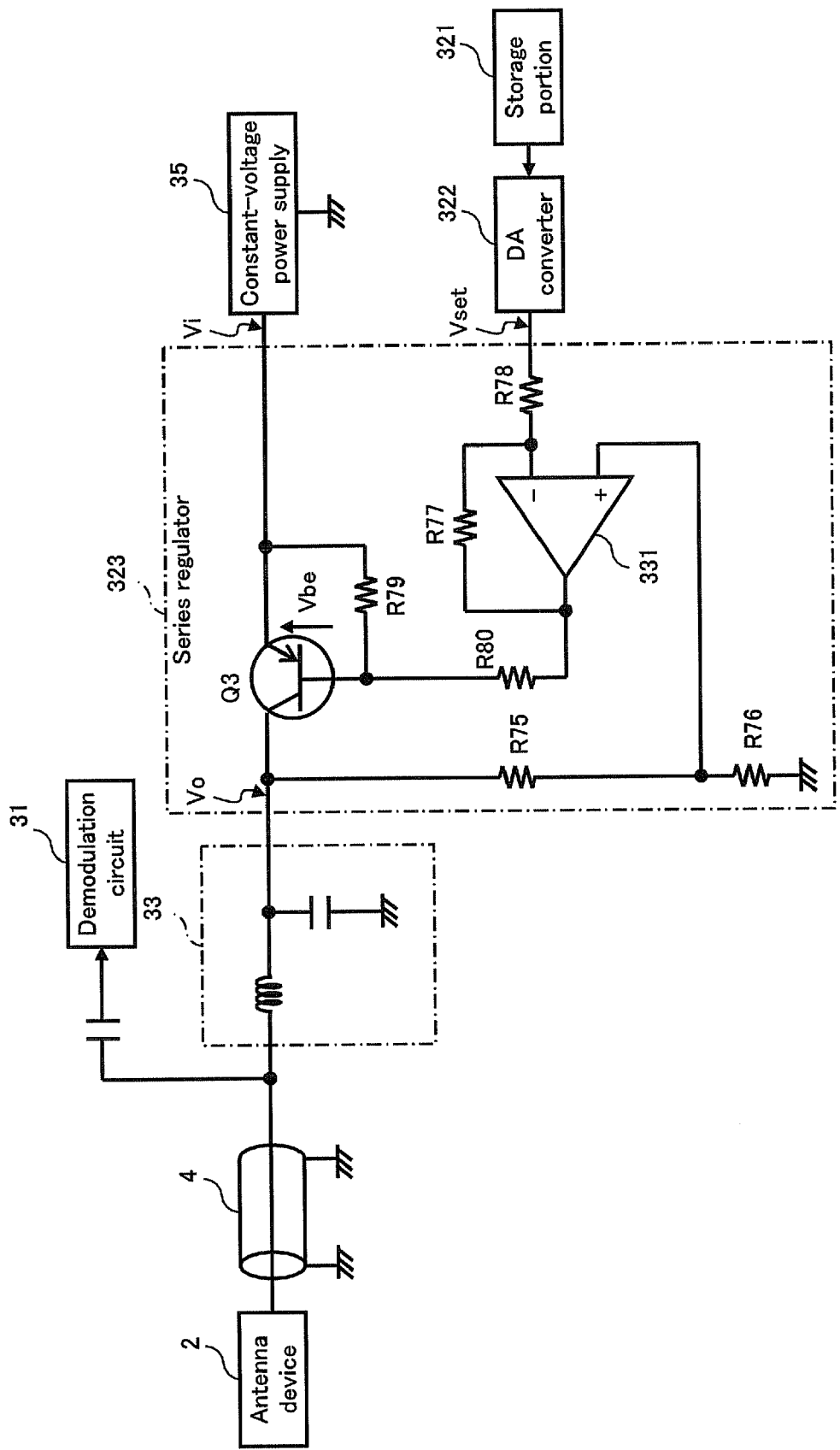
FIG. 4 is a circuit diagram of a demodulating device.

Referring to FIGS. 3 and 4, the demodulating device 3 includes a demodulation circuit 31 for demodulating a high frequency signal transmitted from the antenna device through the feeder cable 4, and a control voltage generating circuit 32.

The control voltage generating circuit 32 generates a predetermined DC control voltage to be supplied to the antenna device 2, and outputs the generated DC control voltage to the feeder cable 4 through which the received high frequency signal is transmitted while superposing the DC control voltage on the feeder cable 4.

The demodulation circuit 31 converts a high frequency signal into an intermediate frequency signal and outputs the converted intermediate frequency signal to a circuit of a back stage such as a digital signal processor (DSP).

The control voltage generating circuit 32 includes a storage portion 321 storing a plurality of control values for adjusting a frequency characteristic of the impedance matching circuit 6 within an allowable range corresponding to a received frequency, a DA converter 322 that reads a control value corresponding to the received frequency from the storage portion 321 and generates a DC voltage corresponding to the control value, and a series regulator 323 that generates a DC control voltage on the basis of an output voltage of the DA converter 322.

A DC power of constant voltage (12V, for example) is supplied from a constant-voltage power supply 35 to the series regulator 323, and a DC control voltage to be output from the series regulator 323 is output to the antenna device 2. An output stage of the series regulator 323 is provided with a low pass filter 33 composed of a capacitor and a coil. The low pass filter 33 prevents a high frequency signal transmitted from the antenna device 2 from being input to the series regulator 323.

The received frequency refers to a frequency selected by a user. Specifically, the received frequency is selected when the user manipulates an operating portion such as a switch or the like provided on a radio, a television set, or the like, and control information corresponding to the received frequency is output to the demodulation circuit 31 and the control voltage generating circuit 32.

Figures 5A, 5B:
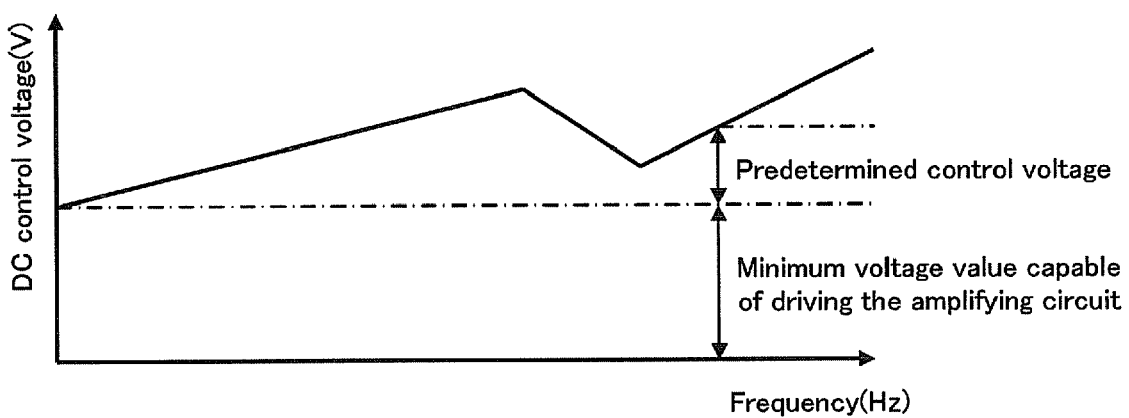
FIG. 5A is an illustration showing a setting table.
FIG. 5B is a characteristic diagram of a DC control voltage relative to received frequency.

The memory 321 is formed of a ROM, an EEPROM, a RAM, or the like. The storage portion 321 stores control values (digital codes indicating output voltages of the DA converter 32) for received frequencies as a setting table. FIG. 5A illustrates the setting table.

Each of the values of the output voltages specified in the setting table is one that is supplied to the impedance matching circuit 6 in order to adjust a frequency characteristic of the impedance matching circuit 6 corresponding to a received frequency.

FIG. 5B shows how the value of the DC control voltage varies corresponding to the received frequency. The value of the DC control voltage is set to a value at which a frequency characteristic of the impedance matching circuit 6 is secured within a predetermined allowable range according to a received frequency.

The allowable range refers to a predetermined range allowed for a frequency characteristic required of the impedance matching circuit 6 in order to completely match the impedances of the antenna 5 and the amplifying circuit 21, and the impedance matching circuit 6 is configured to match the impedances within the allowable range.

The values of the DC control voltage illustrated in FIG. 5B include a minimum level of DC voltage value capable of driving the amplifying circuit 21 of the antenna device 2, that is, a value obtained by adding the value of the supply voltage to be supplied to the amplifying circuit 21 and a control voltage value that varies depending on received frequencies in order to control the impedance matching circuit 6.

It should be noted that the setting table shown in FIG. 5A and the characteristic shown in FIG. 5B are illustrated for exemplary purposes and there is no particular correlation therebetween.

A microcomputer is incorporated in the control voltage generating circuit 32. The microcomputer searches the setting table on the basis of a received frequency that is input to read a control value, and outputs the read control value to the DA converter 322.

It should be noted that the control voltage generating circuit 32 may be formed of a gate array or an application specific integrated circuit (ASIC), instead of the microcomputer.

The DA converter 322 converts a control value input from the microcomputer into an analog DC voltage and outputs it to the series regulator 323.

The series regulator 323 includes a pnp type transistor Q3 connected in series to the constant-voltage power supply 35, resistors R75 and R76 that divide a collector voltage of the pnp type transistor Q3 and generate a feedback voltage, and an error amplifier 331 that compares the feedback voltage with the output voltage of the DA converter 322. A predetermined DC voltage is output by controlling a current through the transistor Q3 on the basis of the feedback voltage.

The series regulator 323 adjusts an input voltage Vi to be supplied from the constant-voltage power supply 35 on the basis of an output voltage Vset of the DA converter 322, and outputs a DC control voltage Vo whose value is equal to or greater than the minimum level capable of driving the amplifying circuit 21.

For example, when resistance values of the resistors R75 and R76 are equal and resistance values of resistors R77 and R78 are equal, and if a voltage between a base and an emitter of the transistor Q3 is Vbe (a value stabilized at approximately 0.6V), a supply voltage from the constant-voltage power supply 35 is Vi, and an output voltage of the DA converter 322 is Vset, then a DC control voltage Vo represented by (Formula 2) is output from the series regulator 323. In this regard, a current amplification factor of the transistor Q3 of a grounded emitter circuit is sufficiently large relative to 1.

$$Vo = Vset + Vi - Vbe - \frac{R80}{R79} \times Vbe \qquad \text{(Formula 2)}$$

The DC control voltage Vo output from the series regulator 323 is supplied to the antenna device 2 through the feeder cable 4, and the impedance matching circuit 6 and the amplifying circuit 21 are driven on the basis of the DC control voltage Vo.

A detailed description will be given below. Referring to FIG. 3, the DC control voltage Vo is supplied to the impedance matching circuit 6 and the amplifying circuit 21 through the low pass filters 33 and 23.

As described above, the DC control voltage Vo is a voltage that is generated on the basis of the received frequency at the demodulating device 3, and that is for adjusting a frequency characteristic of the impedance matching circuit 6 within an allowable range corresponding to a frequency.

The allowable range can be specified by an absolute value of an impedance mismatch, a normalized value of the absolute value of the mismatch, the amount of loss due to the mismatch, or the like.

The absolute value of the impedance mismatch refers to a value (absolute value) obtained by, for example, dividing an impedance (output impedance) viewed from the antenna 5 toward the impedance matching circuit 6 by an impedance (input impedance) viewed from the impedance matching circuit 6 toward the antenna 5.

The normalized value of the absolute value of the mismatch refers to a value obtained by, for example, dividing the absolute value of the impedance mismatch as described above by the absolute value of the input impedance.

The amount of loss due to the mismatch refers to a loss caused by, for example, reflection of a signal that occurs attributable to an impedance mismatch when the signal is transmitted from the antenna device 2 to the amplifying circuit 21, and a decibel value is used in many cases.

That is, the impedance matching circuit 6 according to the present invention may not necessarily match impedance of the antenna 5 with that of the amplifying circuit 21 completely, and may have only to match the impedances so that at least the absolute value of the impedance mismatch, the normalized value of the absolute value of the mismatch, or the amount of loss due to the mismatch is smaller than a predetermined threshold value.

Each of the output voltages specified in the setting table is a DC control voltage determined on the basis of the above idea for each of a plurality of received frequencies each serving as a reference.

Referring to FIG. 6, if the impedance matching circuit 6 is formed of a simple circuit that controls only variable elements of a single system for impedance matching, it becomes difficult to determine DC control voltages that allow for complete impedance matching for all the received frequencies.

With the configuration described above, however, even such a simple impedance matching circuit 6 can determine DC control voltages for impedance matching within an allowable range for all the received frequencies.

Figure 1:
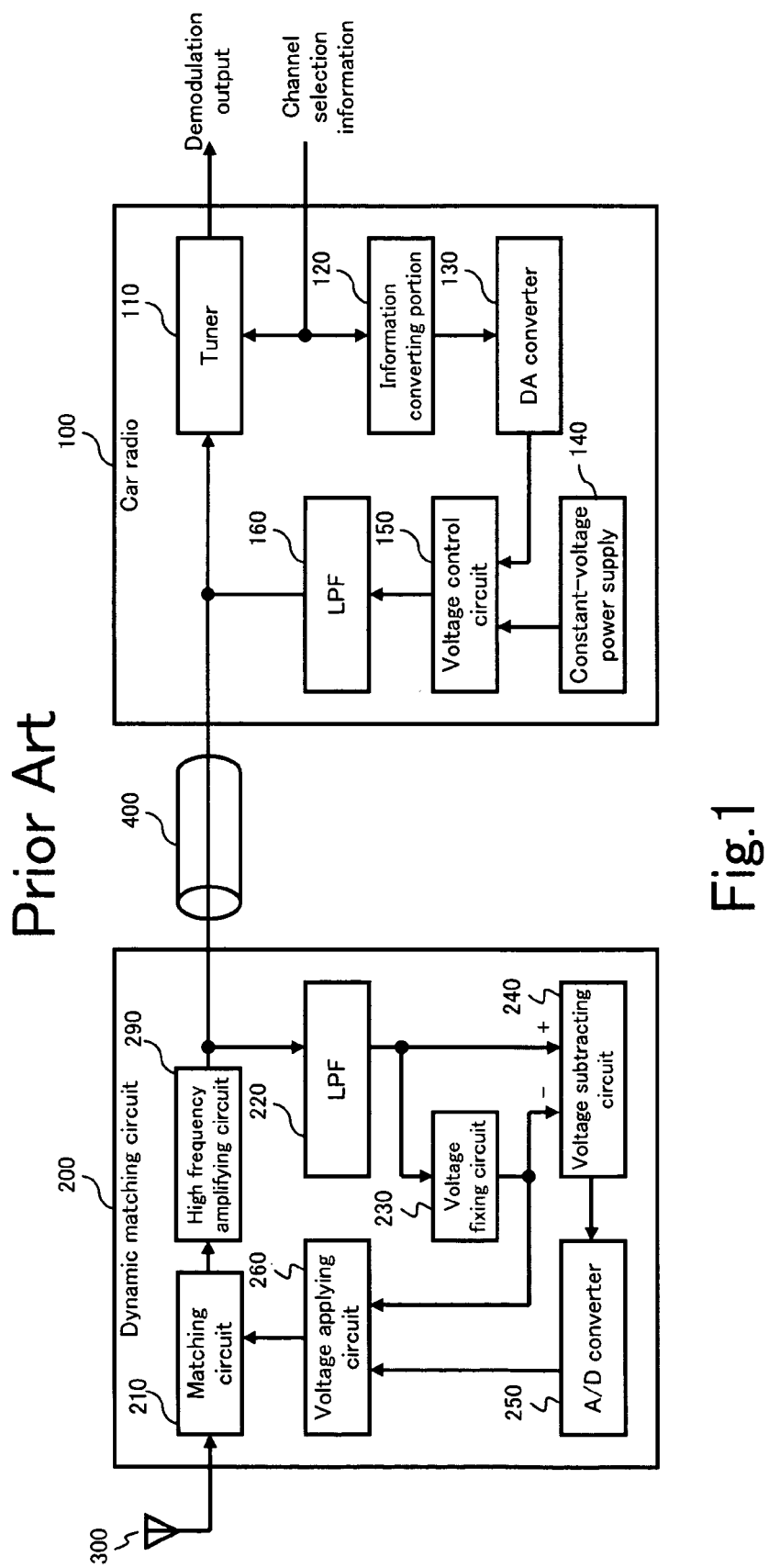
FIG. 1 is a block configuration diagram of a vehicle antenna device that sends a voltage level to a dynamic matching circuit.

Thus, there is no need for incorporating the conventional voltage applying circuit 260 as shown in FIG. 1 into the antenna device 2, thereby simplifying the control circuit for the impedance matching circuit.

The vehicle antenna device of Japanese Patent Application Publication No. 4-298122 includes a circuit block that sends, from a car radio to a dynamic matching circuit, the voltage signal in which a voltage level corresponding to a frequency selection signal is added to a supply voltage, and that generates a DC control voltage for impedance matching on the basis of the frequency selection signal separated from the voltage signal.

In contrast, in the present invention, the demodulating device 3 generates a DC control voltage for impedance matching and transmits the DC control voltage to the antenna device 2.

Examples of an impedance matching circuit to be incorporated into the antenna device 2 and a peripheral circuit thereof will be described below by referring to FIGS. 6 to 12.

A first example will be described. The impedance matching circuit 6 that has already been described by referring to FIG. 6 is used. A DC control voltage Vo output from the demodulating device 3 is applied to an impedance adjustment terminal TZ at one end of the chalk coil L62 of the impedance matching circuit 6 through the low pass filter 23, and impedance matching is carried out so that a frequency characteristic is within an allowable range for each of the received frequencies.

As described in FIG. 5B, the DC control voltage Vo for impedance matching is set to a voltage value that is equal to or greater than a minimum level capable of driving the amplifying circuit 21, and supplied as a power supply for the amplifying circuit 21.

In the case of individually adjusting the capacities of the variable-capacitance diodes D61 and D62 constituting the impedance matching circuit 6, it is necessary to provide a plurality of adjustment terminals for applying different control voltages to the variable-capacitance diodes D61 and D62 and a circuit for generating a control voltage corresponding to each diode.

In the first example, however, since the capacities of the variable-capacitance diodes D61 and D62 can be changed with only a voltage of one system to be applied to the impedance adjustment terminal TZ, the circuit can be simplified.

Figure 7A:
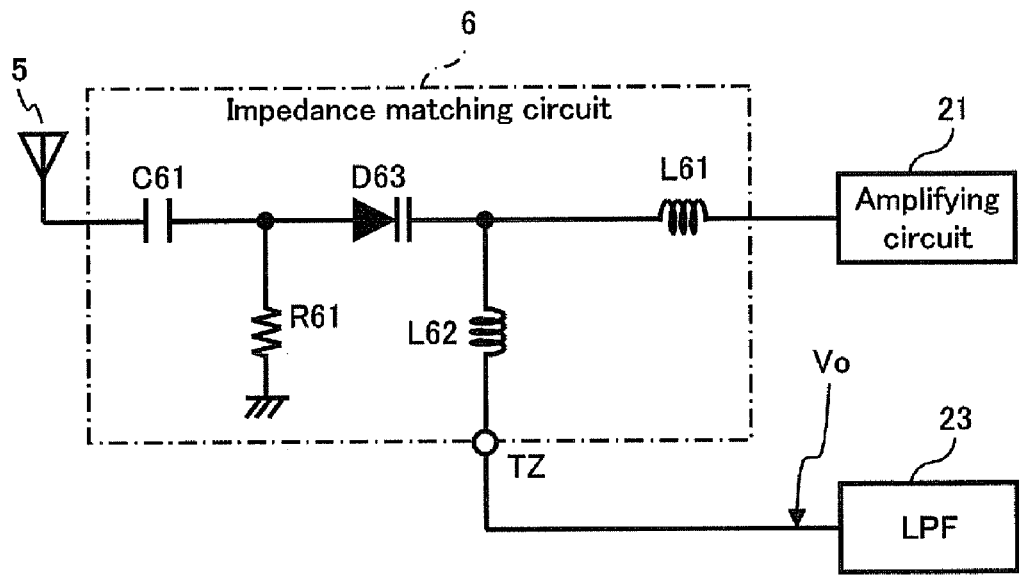
FIG. 7A is a circuit diagram showing a second example of the antenna device.

A second example will be described. Referring to FIG. 7A, a single variable-capacitance diode D63 is incorporated as a variable reactive element into the impedance matching circuit 6, thereby realizing simplification over the first example.

Since the DC control voltage Vo is applied to the single variable-capacitance diode D63, impedance matching is carried out so that a frequency characteristic of each of the received frequencies is secured within an allowable range.

A variable reactive element to be incorporated into the impedance matching circuit 6 is not limited to a semiconductor device such as a variable-capacitance diode, and other devices such as an RF-MEMS (Radio Frequency—Micro Electro Mechanical System) may be used.

An RF-MEMS includes a first signal line arranged on a substrate, a second signal line on an actuator located in an upper part of the first signal line, and a pair of control electrodes for adjusting a distance of the actuator to a surface of the substrate.

The RF-MEMS is an element that adjusts the distance between the actuator and the substrate by adjusting a voltage to be applied to the control electrodes, thereby adjusting the capacity between the first signal line and the second signal line.

Figure 7B:
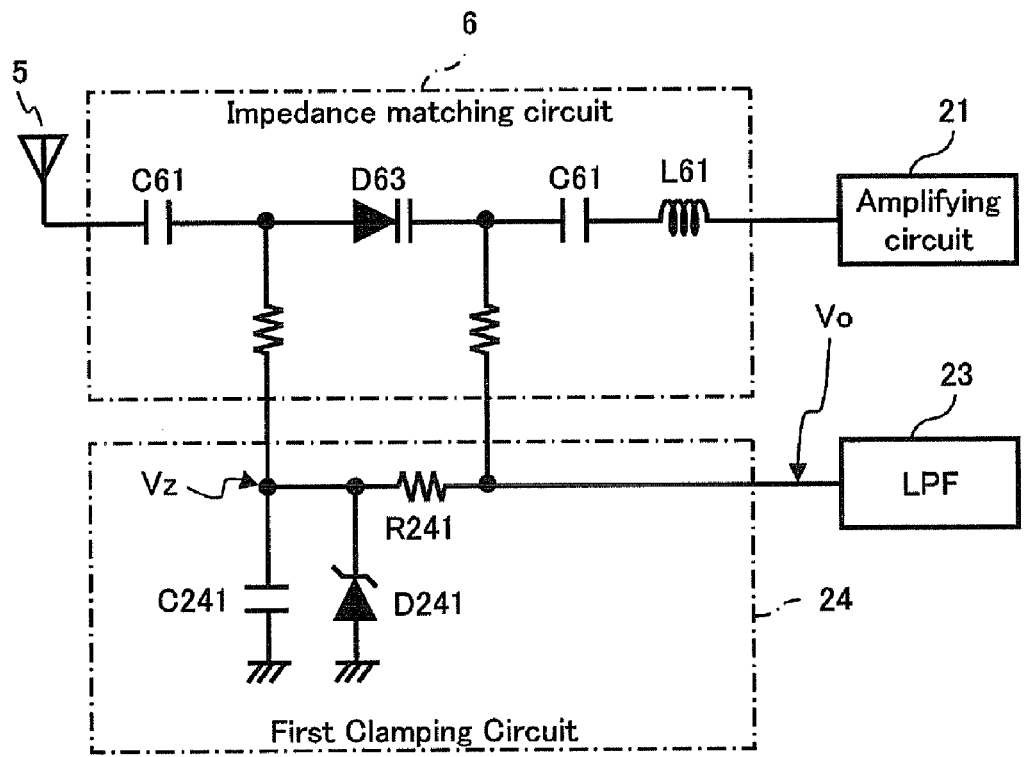
FIG. 7B is a circuit diagram showing a third example of the antenna device.

A third example will be described. Referring to FIG. 7B, such a configuration is employed that a first clamping circuit 24 for clamping a DC control voltage Vo to a predetermined voltage is provided, and a difference voltage between the DC control voltage Vo and a voltage resulting from the clamping by the first clamping circuit 24 is applied to the variable reactive element D63.

The first clamping circuit 24 includes a zener diode D241, a resistance R241 connected in series between the zener diode D241 and the low pass filter 23, and a capacitor C241 connected in parallel to the zener diode D241. The capacitor C241 is an element for removing high frequency components.

A clamp voltage Vz resulting from clamping by the zener diode D241 is applied to an anode of the variable reactive element D63, and the DC control voltage Vo is applied to a cathode of the variable reactive element D63. Such a configuration is employed that a difference of voltages (Vz−Vo) applied to the variable reactive element D63 adjusts capacity.

Generally, an appropriate minimum drive voltage is determined for each element to be used in the amplifying circuit 21. If the amplifying circuit 21 is driven with a lower voltage than the minimum drive voltage, a gain is lowered and a strain characteristic of an output voltage relative to an input voltage or the like degrades. In the bipolar transistor Q211 described above, when the drive voltage falls below 3V, a gain may be lowered and the strain characteristic may degrade. In view of this, in this embodiment, the DC control voltage V0 is set to a voltage equal to or greater than a minimum voltage of 3V capable of driving the amplifying circuit 21.

Figure 8:
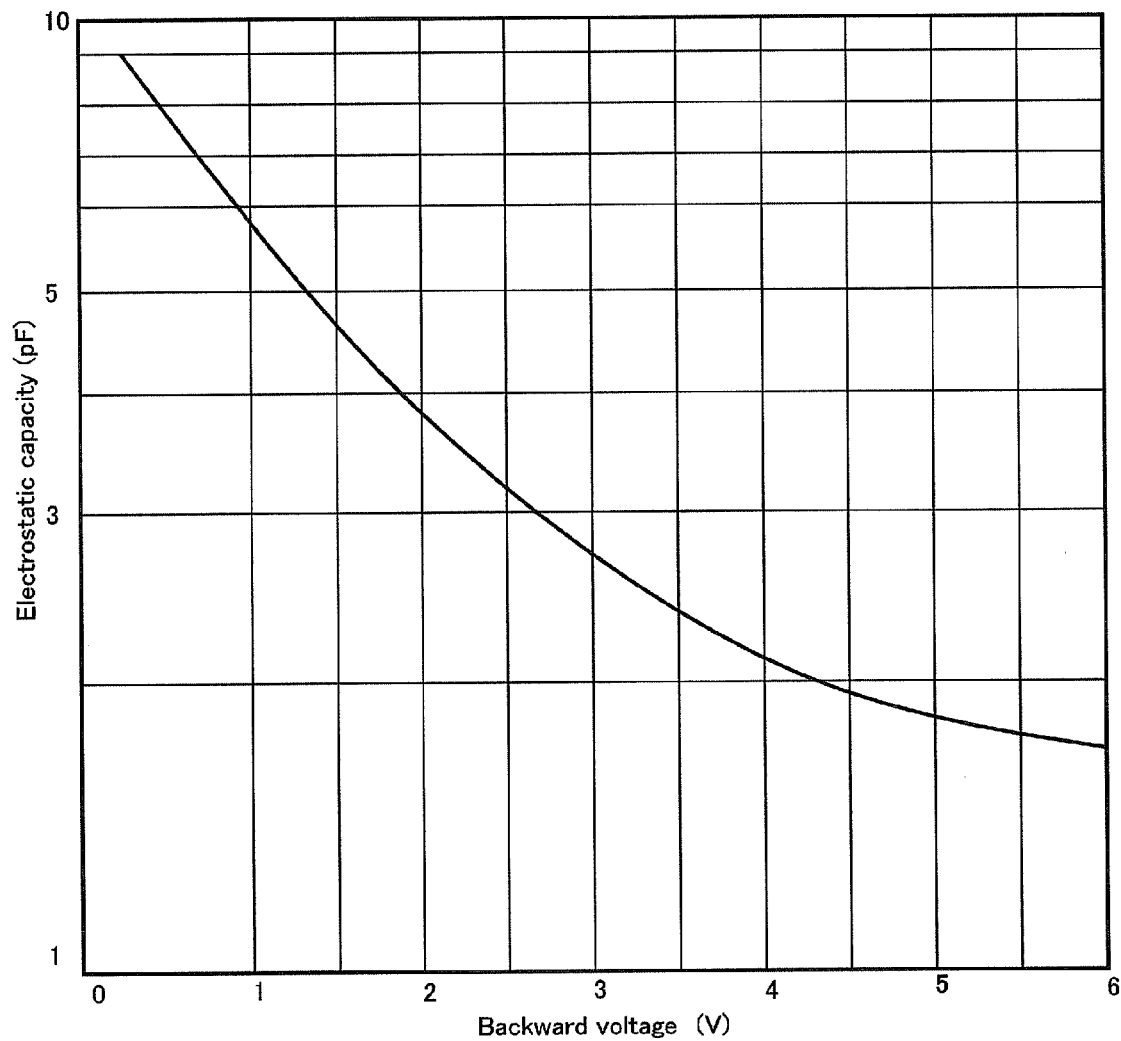
FIG. 8 is an illustration showing a characteristic example of electrostatic capacity relative to a backward voltage of a variable-capacitance diode.

In FIG. 8, an electrostatic capacity characteristic relative to applied voltages of the variable-capacitance diodes D61, D62, and D63 shown in FIGS. 6, 7A and 7B is shown on a logarithmic graph. The variable-capacitance diodes have a greater percentage of change of the electrostatic capacity relative to change of applied voltage in an area with a lower applied voltage than in an area of a higher applied voltage.

For example, if the DC control voltage Vo is changed to 6V from the minimum value of 3V, the electrostatic capacity changes from approximately 2.6 pF to 1.6 pF.

In the third example, if the zener voltage of the zener diode D241 incorporated in the first clamping circuit 24 is set to 2.5V and the DC control voltage Vo is changed to 6V from the minimum value of 3V, a voltage to be applied to the variable-capacitance diodes changes from 0.5V to 3.5V and the electrostatic capacity changes from approximately 7.9 pF to 2.4 (pF).

Thus, with the third example, an adjustment margin of reactance for variable reactive elements of same characteristics can be widened as compared with the first and second examples, thereby increasing the degree of freedom in circuit design of the impedance matching circuit 6.

Figure 9:
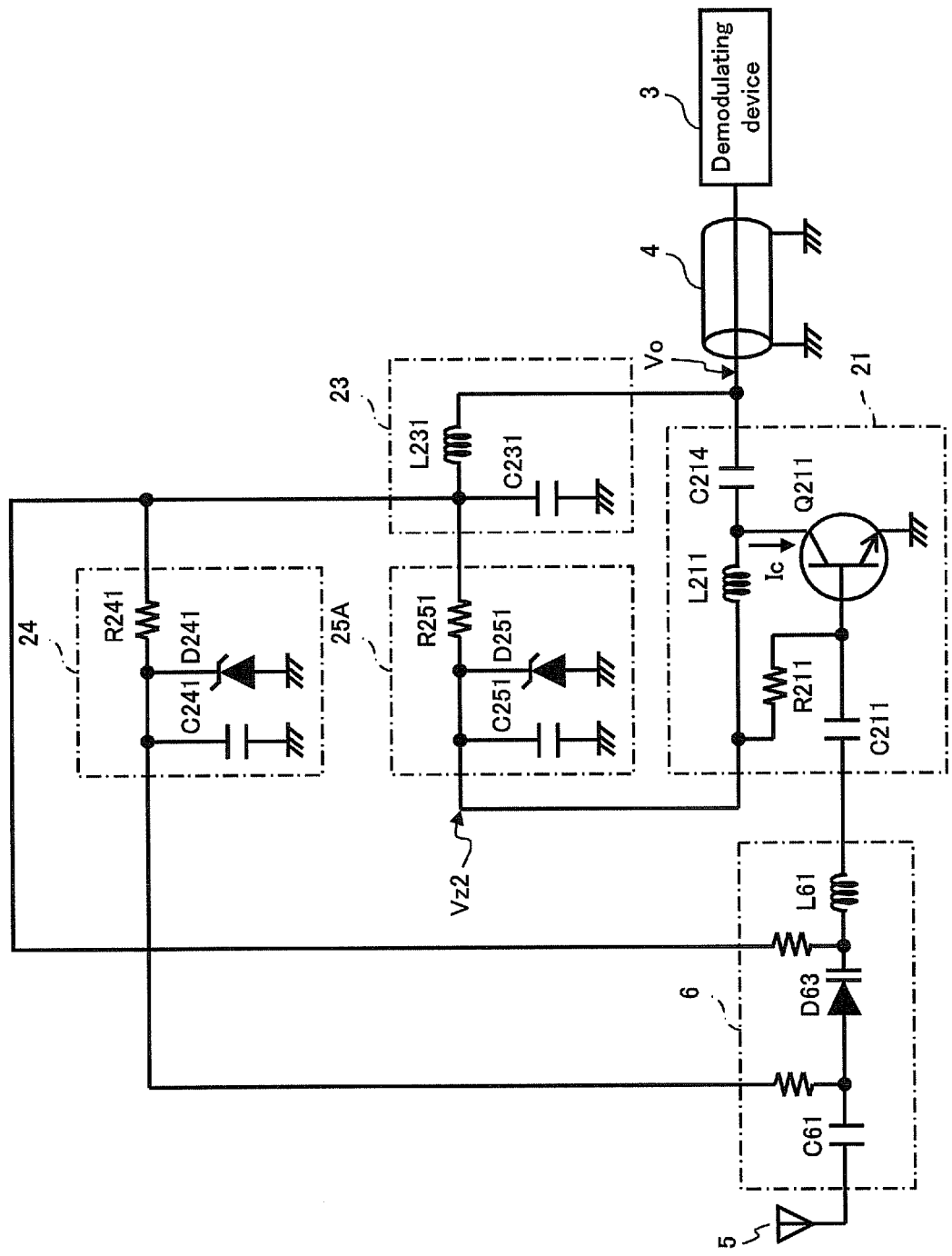
FIG. 9 is a circuit diagram of a fourth example of the antenna device.

A fourth example will be described. Referring to FIG. 9, such a configuration is employed that in addition to the circuit shown in FIG. 7B, a second clamping circuit 25A for clamping a DC control voltage to a predetermined voltage is further provided, so that a voltage resulting from the clamping by the second clamping circuit 25A is applied as a drive voltage to the amplifying circuit 21.

The second clamping circuit 25A comprises a zener diode D251, a resistor R251 connected in series between the zener diode D251 and the low pass filter 23, and a capacitor C251 connected in parallel to the zener diode D251. The capacitor C251 is an element for removing high frequency components.

A clamp voltage Vz2 clamped by the zener diode D251 is applied to a collector of the transistor Q211.

In the amplifying circuit 21, a DC shielding capacitor C214 is provided to prevent a DC control voltage Vo from being applied directly to the collector of the transistor Q211 from the feeder cable 4.

In the first to the third examples, a DC control voltage Vo that varies its level is applied to the collector of the transistor Q211 in order to carry out impedance matching depending on a received frequency. The collector current of the transistor Q211 varies accordingly, and a gain of the amplifying circuit 21, input impedance, output impedance, and power consumption, and the like change, which makes the design of the amplifying circuit 21 difficult.

In the fourth example, however, since the second clamping circuit 25A is provided, a constant clamp voltage Vz2 can always be applied to the collector of the transistor Q211 even when the DC control voltage Vo changes.

This makes the design of the amplifying circuit 21 easier and minimizes the change in gain, input impedance, output impedance, and power consumption, thus realizing an amplifying circuit 21 capable of stable operations.

In the fourth example, since a strong input characteristic of the transistor Q211 degrades when the collector current of the transistor Q211 is lowered, normally, the amplifying circuit is designed so that a great collector current within an allowable range passes through the transistor Q211. As a result, power to be consumed by the resistor R251 connected to the zener diode D251 increases, which arises a need for selecting a large resistance having sufficient heat capacity, thereby hindering downsizing of the circuit.

For example, in the circuit shown in FIG. 9, if the collector current Ic of the transistor Q211 is 30 mA, the DC control voltage Vo is 4 V to 8V, and the voltage Vz to be applied to the transistor Q211 is 3V, then power to be consumed by the resistor R251 will be the highest, (Vo−Vz)×Ic=0.15W, at Vo=8V.

In such a case, a resistor 251 having sufficient rated heat capacity must be selected from the viewpoint of design, and a resistance of a large rated heat capacity of approximately 0.5W is necessary to allow the power consumption of 0.15W. In addition, for the zener diode D251, through which a large current passes, a zener diode having large rated heat capacity is necessary, thus making downsizing of the antenna device 2 even more difficult.

Additionally, the degradation of the strong input characteristic refers to degradation of characteristic of an amplifying circuit when a broadcasting wave having such a large power as a few kilowatts is received in the vicinity of a transmitting antenna of a broadcasting station, and refers to a phenomenon in which a large strain or the like occurs in output when a large voltage of several volts is applied to the transistor Q211.

Figure 10:
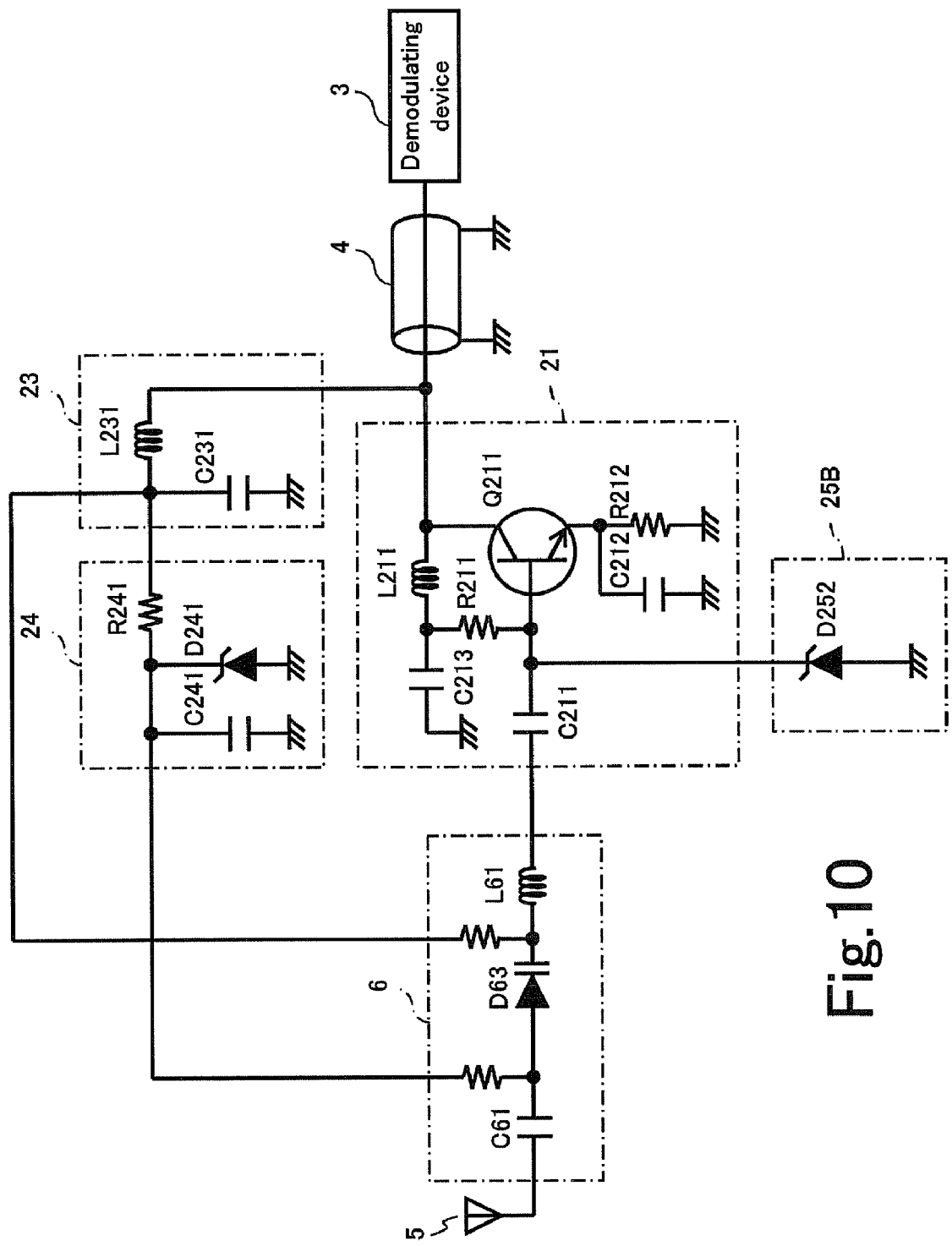
FIG. 10 is a circuit diagram of a fifth example of the antenna device.

The problems described in the fourth example will be solved by a fifth example. The fifth example will be descried below. Referring to FIG. 10, in addition to the circuit shown in FIG. 7B, a third clamping circuit 25B formed of the zener diode D252 that clamps a DC control voltage Vo to a predetermined voltage is provided, so that a voltage clamped by the third clamping circuit 25B is applied as an input bias voltage of the amplifying circuit 21.

A parallel circuit of a resistance R212 and a capacitor C212 is connected to an emitter of a transistor Q211, and a capacitor C213 for removing high frequency components is connected to a connecting point of a resistance R11 and a coil L211. The capacitor C212 is a bypass capacitor for preventing gain degradation.

A DC control voltage Vo is applied to a collector of the transistor Q211, and a high-frequency signal received by the antenna 5 is input into a base and amplified. When a collector current increases following fluctuation of the DC control voltage Vo or the like, an emitter voltage rises by a current passing through the resistance R212 and a voltage between the base and the emitter decreases accordingly. When the voltage between the base and the emitter decreases, a base current decreases and the collector current decreases. That is, the resistor R212 absorbs the fluctuation of the collector current of the transistor Q211, which enables stabilized operations.

With this configuration, such an amplifying circuit 21 can be implemented that does not need any large component requiring high power consumption even when the DC control voltage Vo fluctuates, and can operate in a stable manner while facilitating downsizing of a circuit.

Figure 11:
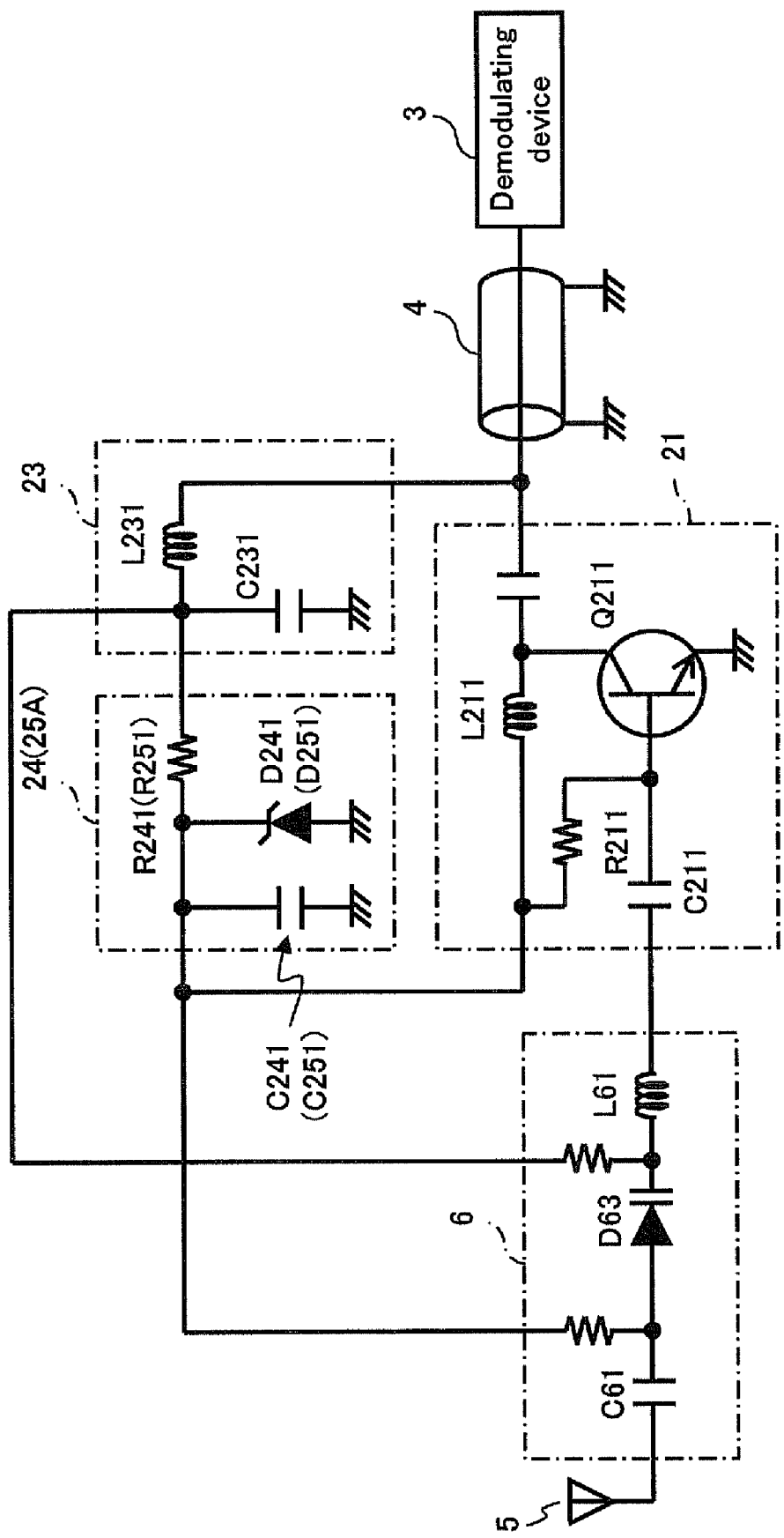
FIG. 11 is a circuit diagram of an antenna device in which the circuit shown in FIG. 9 serves as a first clamping circuit and a second clamping circuit.
Figure 12:
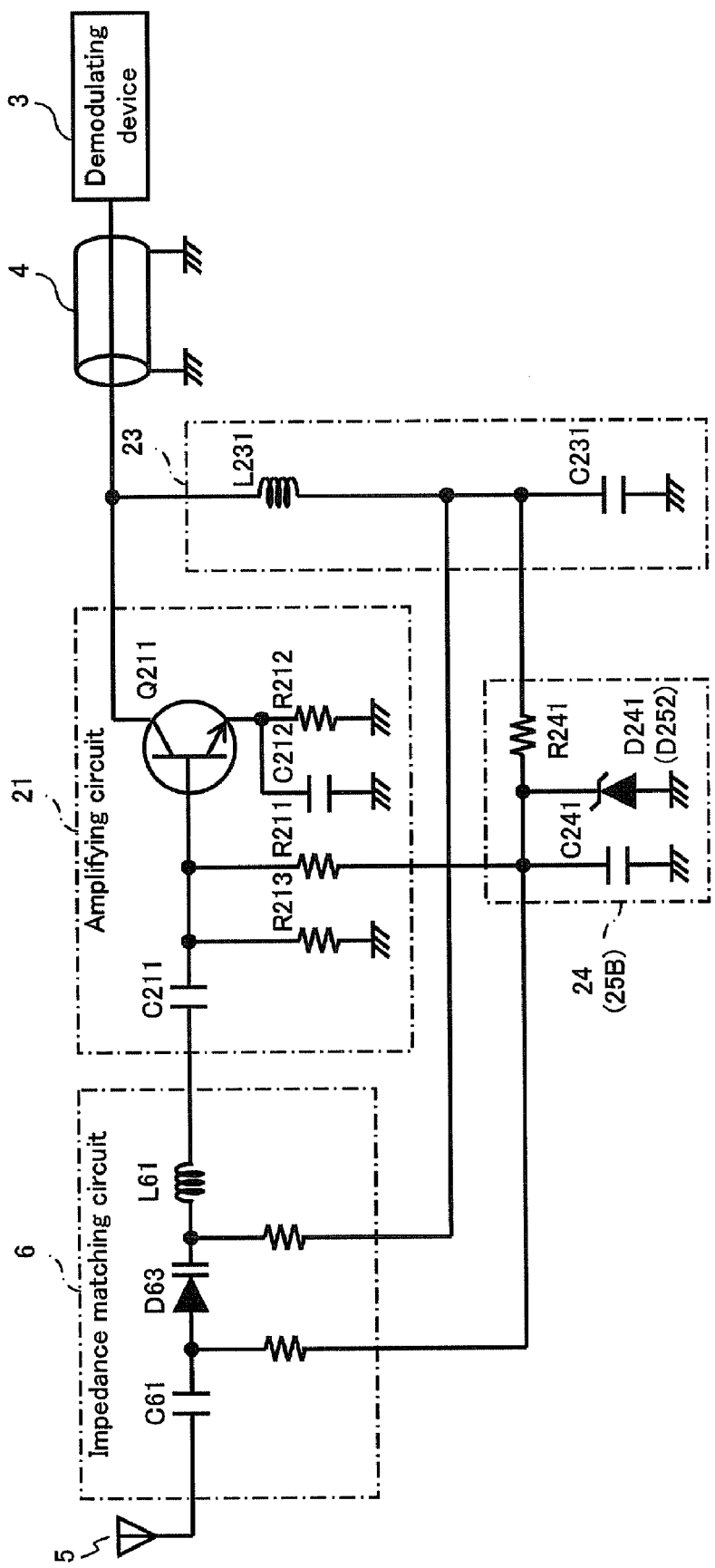
FIG. 12 is a circuit diagram of an antenna device in which the circuit shown in FIG. 10 serves as the first clamping circuit and a third clamping circuit.

A sixth example will be described based on FIGS. 11 and 12. FIG. 11 shows a circuit configuration in which the first clamping circuit 24 also serves as the second clamping circuit 25A shown in FIG. 9. In addition, FIG. 12 shows a circuit configuration in which the first clamping circuit 24 also serves as the third clamping circuit 25B shown in FIG. 10. In the circuit shown in FIG. 12, a pulldown resistor R213 is provided in the amplifying circuit 21.

This is an example in which the number of elements to be used in the circuit is reduced by using the first clamping circuit 24 also as the second clamping circuit 25A or using the first clamping circuit 24 also as the third clamping circuit 25B, thereby trying to further downsize the circuit.

A receiving device including the circuit shown in FIG. 11 can be expressed by functional blocks shown in FIG. 15A. In the demodulating device 3, a control voltage generating circuit 32 generates a control voltage necessary for impedance matching corresponding to a received frequency, and the control voltage is superposed on a supply voltage supplied from the constant-voltage power supply 35, thus generating a DC control voltage Vo.

FIG. 15B shows a condition in which the control voltage is added to a constant supply voltage. In FIG. 15B, the line above the hatched area represents the DC control voltage Vo, while the line therebelow represents a minimum level of supply voltage capable of driving the amplifying circuit 21.

The DC control voltage Vo changes stepwise at a timing of change of the received frequency. The horizontal axis indicates time and the vertical axis indicates voltage level.

In contrast, in the antenna device 2, the first clamping circuit 24 is formed of the functional blocks of a regulator 241 and a subtracting circuit 242.

Referring to FIG. 15C, the supply voltage separated from the DC control voltage Vo by the regulator 241 is supplied to the amplifying circuit 21. Referring to FIG. 15D, a control voltage resulting from subtracting the supply voltage from the DC control voltage Vo by the subtracting circuit 242 is supplied to the impedance matching circuit 6.

Figure 13:
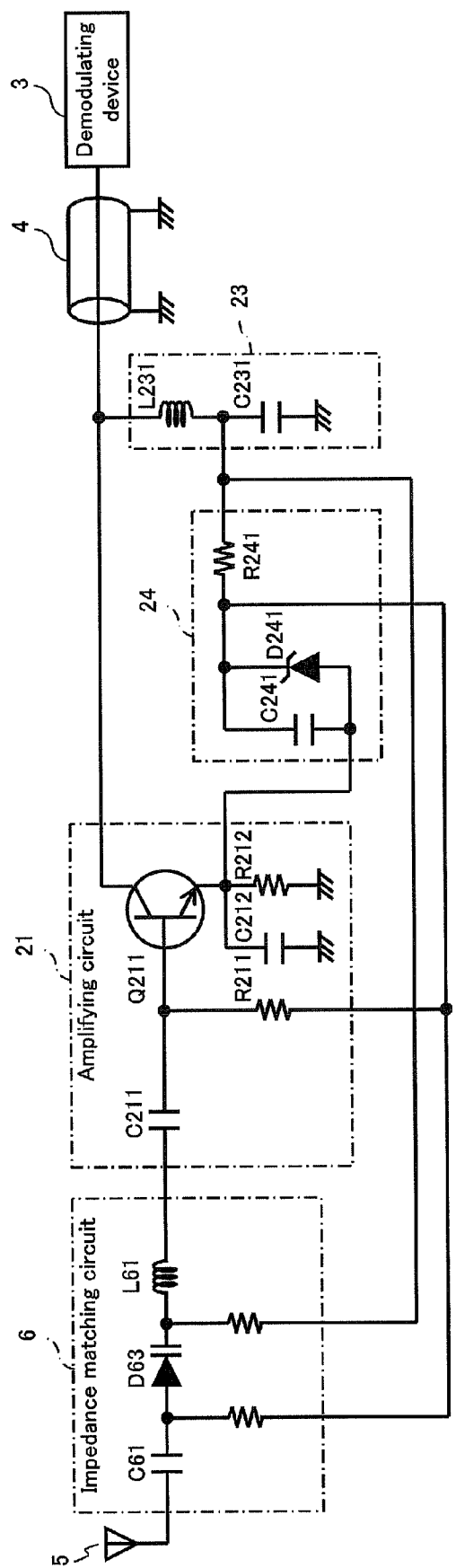
FIG. 13 is a circuit diagram of a seventh example of the antenna device.

A seventh example will be described. Referring to FIG. 13, the amplifying circuit 21 is formed of an amplifying element including a current feedback bias circuit, and the first clamping circuit 24 is connected in parallel to a feedback resistor. An anode of a zener diode D241 constituting the first clamping circuit 24 shown in FIG. 7B is configured to be connected to the emitter of the transistor Q211.

The transistor Q211, the resistor R211, the capacitor C212, and the resistance R212 constitute a current feedback bias circuit. The zener diode D241 supplies a constant voltage to the base of the transistor Q211.

As described in the fifth example, the resistor R212 absorbs the fluctuation of the collector current of the transistor Q211 and the capacitor C212 prevents gain depression of the amplifying circuit 21.

An emitter voltage of the transistor Q211 is configured to decrease by setting the value of the resistor R241 of the first clamping circuit 24 to a value greater than the value of the resistor R212 of the amplifying circuit 21.

The above configuration reduces a ratio of fluctuation of the emitter voltage to fluctuation of the DC control voltage Vo. As a result, the amplifying circuit 21 that can operate in a more stable manner than the fifth example is implemented.

A second embodiment will be described below.

This embodiment is an example of a receiving device including a plurality of antenna devices described above.

Figure 16:
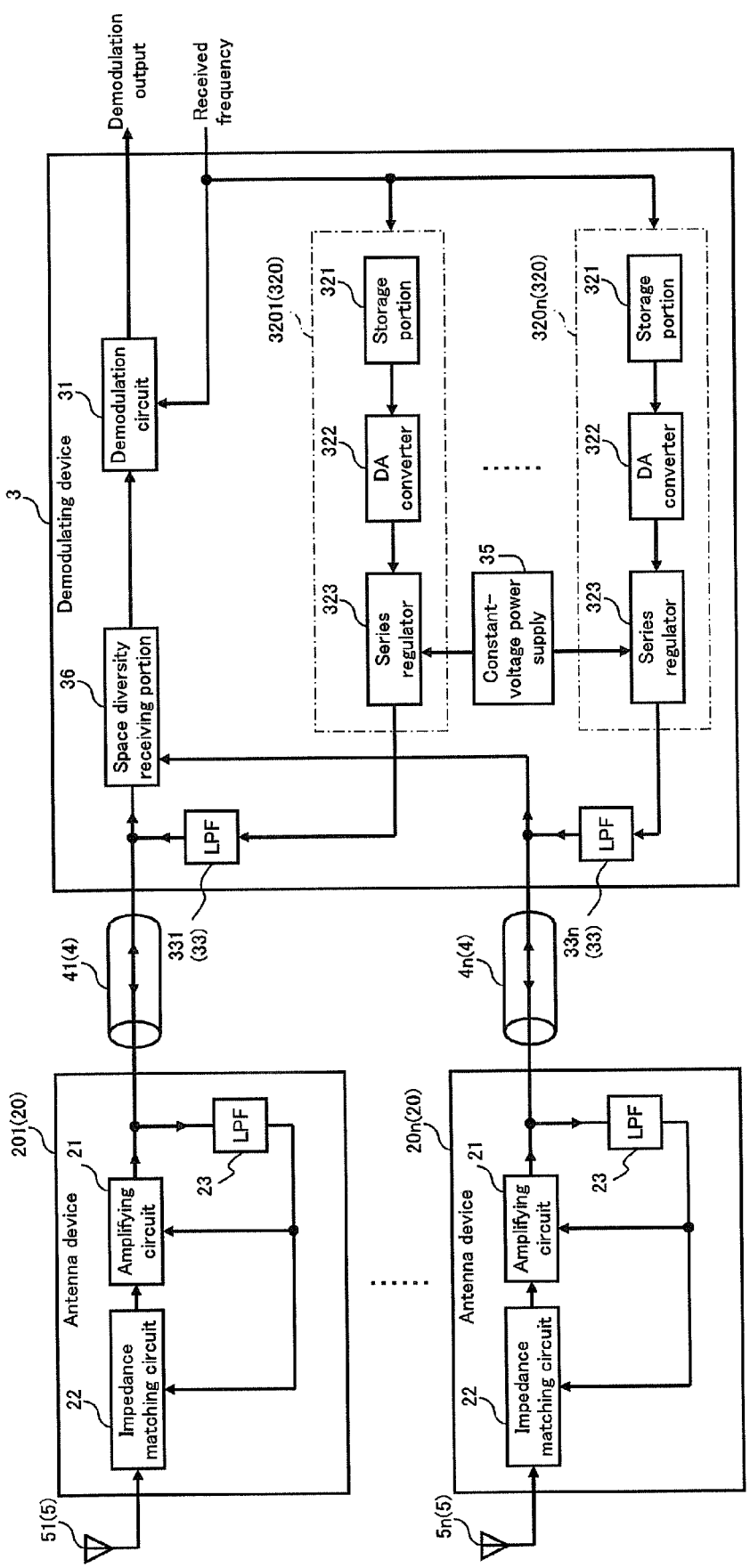
FIG. 16 is a block configuration diagram of a receiving device according to a second embodiment.

Referring to FIG. 16, the receiving device has antenna devices 20 (201 to 20n) placed adjacent to a plurality of antennas 5 (51 to 5n) and connected to a demodulating device 3 through feeder cables 4 (41 to 4n).

Each feeder cable 4 is formed of one coaxial cable, and a high frequency signal to be transmitted from each antenna device 20 to the demodulating device 3 and a DC control voltage Vo to be transmitted from the demodulating device 3 to the each antenna device 20 are transmitted through the coaxial cable.

Each antenna device 20 is configured to include an impedance matching circuit 22, an amplifying circuit 21 for amplifying output of the impedance matching circuit 22, and a low pass filter 23, and to transmit a high frequency signal output from the amplifying circuit 21 to the demodulating device 3 through the feeder cable 4.

Any of the circuits already described may be employed as an internal circuit constituting each antenna device 20.

Each antenna 5 receives at least one broadcasting wave of digital TV broadcasting, AM broadcasting, FM broadcasting, and the like. Receiving the same type of broadcasting waves by a plurality of antennas 5 enables space diversity reception. For example, such a configuration is possible that the antennas 51 to 53 receive digital TV broadcasting waves, the antennas 54, 55 receive AM broadcasting waves, and the antenna 56 receives FM broadcasting waves.

The demodulating device 3 includes a space diversity receiving portion 36, a demodulation circuit 31, and a control voltage generating circuits 320 (3201 to 320n). It is particularly effective to provide the space diversity receiving portion 36 when receiving digital TV broadcasting waves.

The space diversity receiving portion 36 selects or synthesizes any of a plurality of high frequency signals transmitted through the feeder cables 4 from the antenna devices 20, and outputs the high frequency signal to the demodulation circuit 31.

The demodulation circuit 31 demodulates the high frequency signal selected or synthesized by the space diversity receiving portion 36.

The control voltage generating circuits 320 (3201 to 320n) generates a DC control voltage Vo that adjusts a frequency characteristic of the impedance matching circuit 22 incorporated in the antenna device 20 within an allowable range corresponding to a received frequency, and outputs the DC control voltage Vo to the feeder cable 4.

Figure 17:
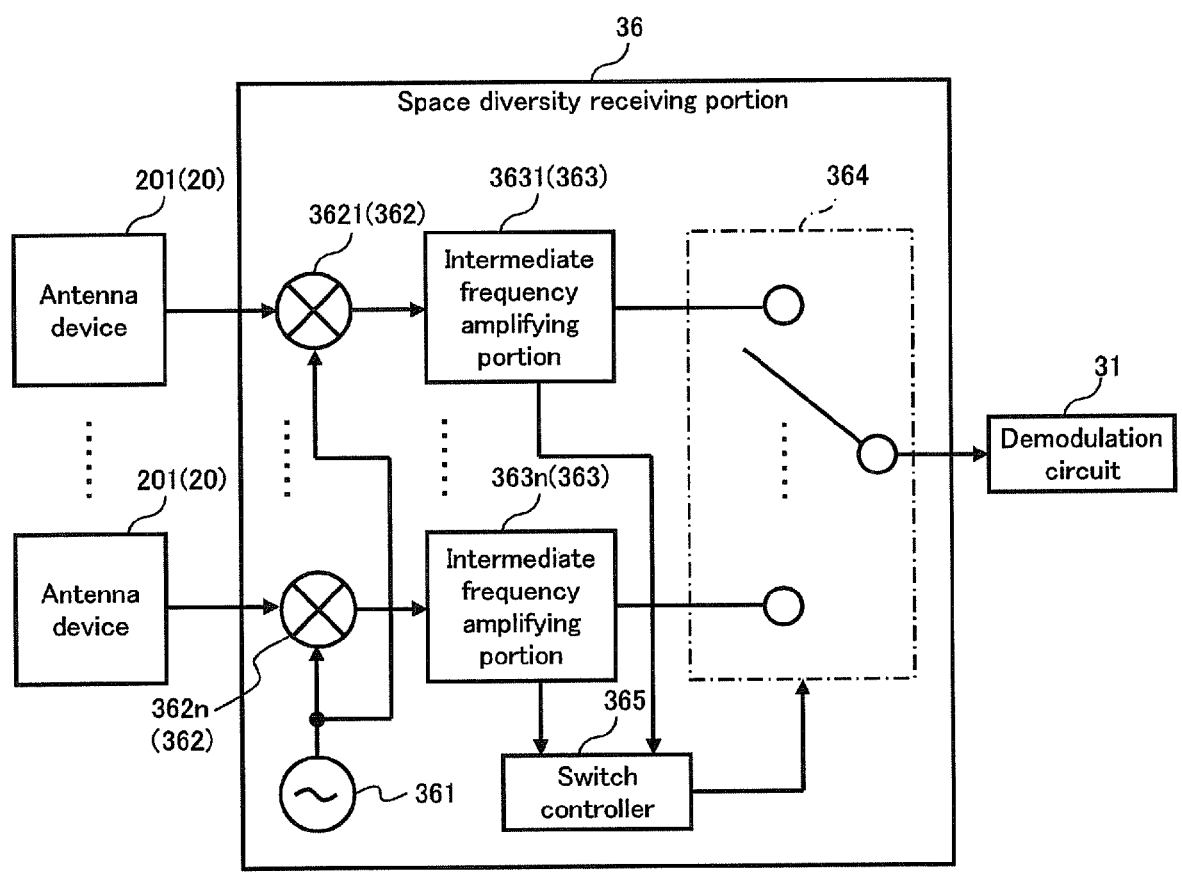
FIG. 17 is a block configuration diagram of a space diversity receiving portion.

Referring to FIG. 17, the space diversity receiving portion 36 is a receiving portion of what is called an antenna selection system, which includes a local oscillating circuit 361, mixers 362 (3621 to 362n), a switch portion 364, and a switch controller 365.

The local oscillating circuit 361 oscillates a frequency signal of a difference between the frequency of the high frequency signal input from the each antenna device 20 and the intermediate frequency.

The mixers 362 (3621 to 362n) each mix the high frequency signal and an output signal of the local oscillating circuit 361 to generate an intermediate frequency signal.

The switch portion 364 selects any of the intermediate frequencies corresponding to the antenna devices 20 and outputs the selected intermediate frequency to the demodulating device 31.

The switch controller 365 detects the intermediate frequency signals corresponding to the antenna devices 20 and changes the switch portion 364 to an intermediate frequency signal that has the best reception condition.

It should be noted that the space diversity receiving portion 36 is not limited to the antenna selection system, but may be of, for example, a maximum ratio synthesis system, which synthesizes the phases of the intermediate frequency signals corresponding to the plurality of antenna devices 20 and outputs the synthesized phase to the demodulation circuit 31.

It should also be noted that the high frequency signal is not necessarily be converted down to the intermediate frequency signal by the space diversity receiving portion 36, but may be converted down to the intermediate frequency signal by the demodulation circuit 31.

The demodulation circuit 31 demodulates the intermediate frequency signal to be input from the space diversity receiving portion 36 to a base band signal, and outputs the processed signal to a circuit at back stage such as a digital signal processor (DSP). The circuit at back stage reproduces an audio signal or a video signal.

The control voltage generating circuits 320 are individually provided corresponding to the antenna devices 20. Each control voltage generating circuit 320 outputs a DC control voltage VO to a corresponding antenna device 20.

Thus, even in any of the cases where the impedance matching circuits 22 of the antenna devices 20 have different frequency characteristics, i.e., different received frequencies, where the impedance matching circuits have different configurations even though the received frequencies are equal, and where the to-be-connected antenna have different impedances even though the received frequencies and the impedance matching circuits are equal, impedance matching becomes possible in each case, thereby improving the degree of freedom in designing of the antenna circuit.

Referring to FIGS. 4 and 16, each control voltage generating circuit 320 includes a storage portion 321 storing a control value that adjusts a frequency characteristic of the impedance matching circuit 22 within an allowable range corresponding to a received frequency, a DA converter 322 for reading control data corresponding to the received frequency from the storage portion 321 and generating a DC voltage corresponding to the control data, and a series regulator 323 for generating a DC control voltage Vo on the basis of an output voltage of the DA converter 322.

The demodulating device 3 further includes a constant-voltage power supply 35 for supplying a constant voltage (e.g., 12V) to a corresponding series regulator 323, and a plurality of low pass filters 33 (331 to 33n) that are provided for every antenna device 20 and prevent the antenna devices 20 from inputting high frequency signals into the series regulators 323.

The operation of each portion is as described above.

In addition, such a configuration may be employed that the control voltage generating circuit 320 is shared by a plurality of antenna devices 20.

Figure 18A:
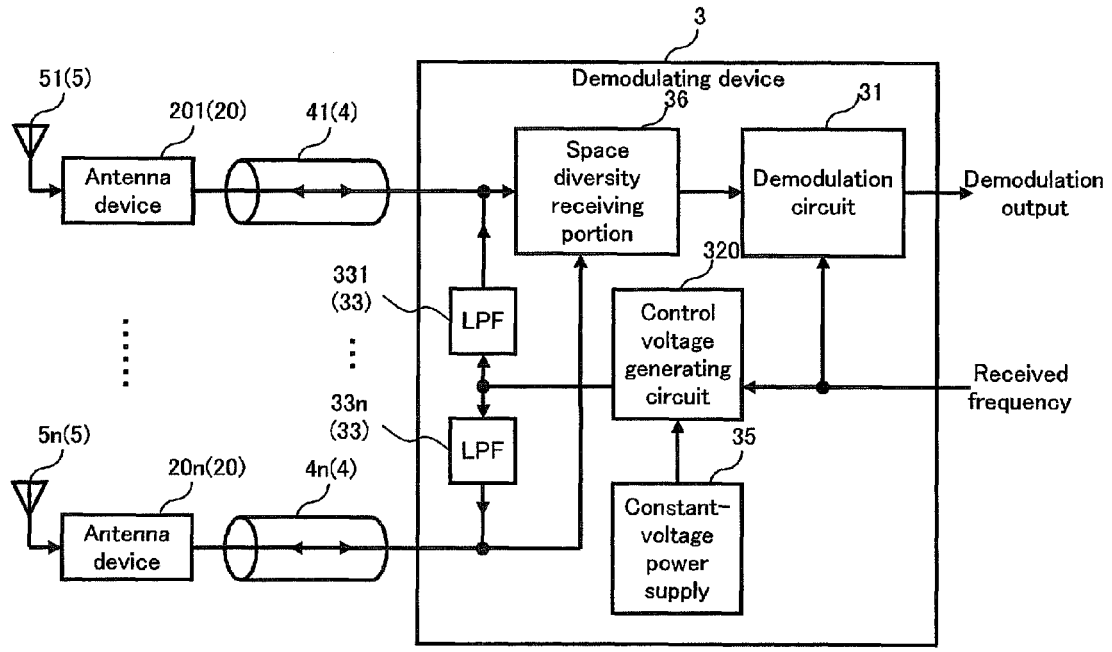
FIG. 18A is a block configuration diagram of a demodulating device including one control voltage generating circuit.

For example, such a configuration may be employed that the demodulating device 3 includes a single control voltage generating circuit 320 to be shared by all the antenna devices 20, as shown in FIG. 18A.

Figure 18B:
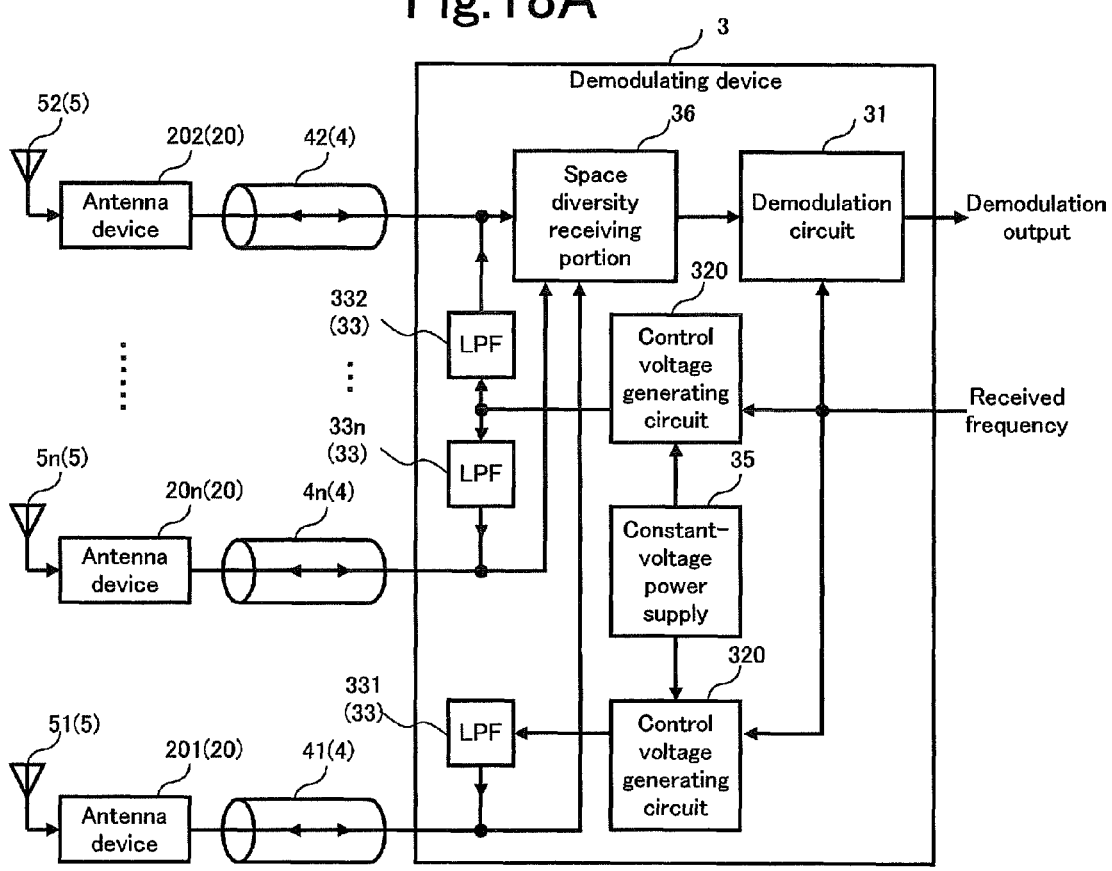
FIG. 18B is a block configuration diagram of a demodulating device including a plurality of control voltage generating circuits.

Such a configuration may also be employed that the demodulating device includes a plurality of control voltage generating circuits 320, and any of the control voltage generating circuits 320 is shared by a plurality of antenna devices 20, or any of the control voltage generating circuits 320 is shared by a single antenna device 20, as shown in FIG. 18B.

As in the circuit configuration of FIG. 6, when the circuit configurations of the antenna devices 20 are the same, that is, the impedance matching circuits 22 have the same frequency characteristics, impedance matching is carried out appropriately at each antenna device 20 if the same DC control voltage Vo is applied corresponding to same received frequencies.

In such a case, a single control voltage generating circuit 320 may be shared. As a result, the number of necessary control voltage generating circuits 320 decreases, which enables a down-sized demodulating device 3 with a simple and inexpensive circuit configuration.

In order to employ such an antenna device 20, it is necessary to use antennas 5 having identical or symmetrical shapes with equal dielectric constants and equal frequency characteristics, or antennas 5 having similar shapes with different dielectric constants and equal frequency characteristics.

Figure 19A:
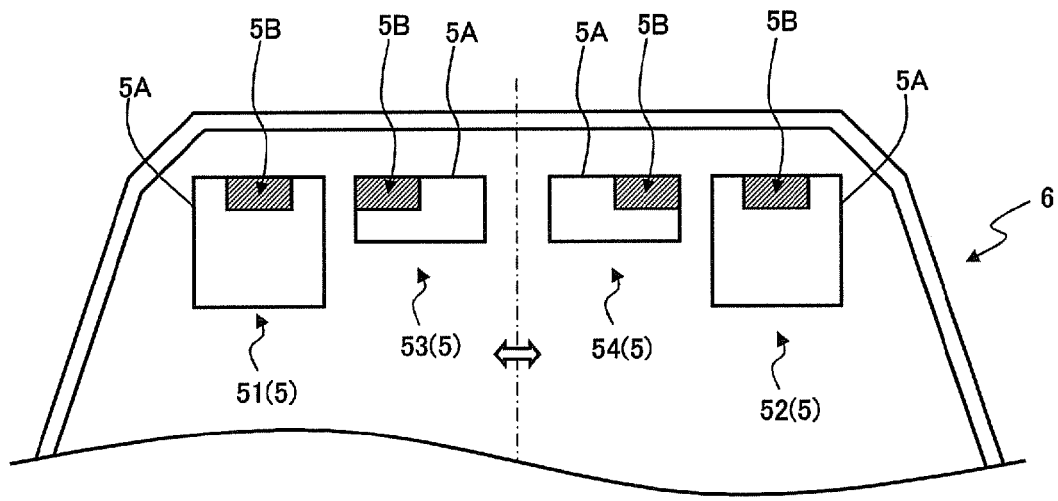
FIG. 19A is an illustration showing a configuration in which antennas having an identical and axisymmetrical shape are arranged axisymmetrically on a windshield glass of a vehicle.

Examples of such antennas include film-like loop antennas 5A attached to a windshield glass or a rear window glass of a vehicle or the like, and antennas each including a feeder circuit 5B for feeding power to both ends of a conductor of each loop antenna 5A, as shown in FIG. 19A. The antenna device 20 is placed adjacent to the antenna 5 together with the feeder circuit 5B.

FIG. 19A shows an example where antennas 51 and 52 having identical shapes and equal dielectric constants are arranged on the windshield glass 6 of the vehicle axisymmetricaly, and an example where antennas 53 and 54 having axisymmetric shapes and equal dielectric constants are arranged on the windshield glass 6 in a line-symmetric manner.

Figure 19B:
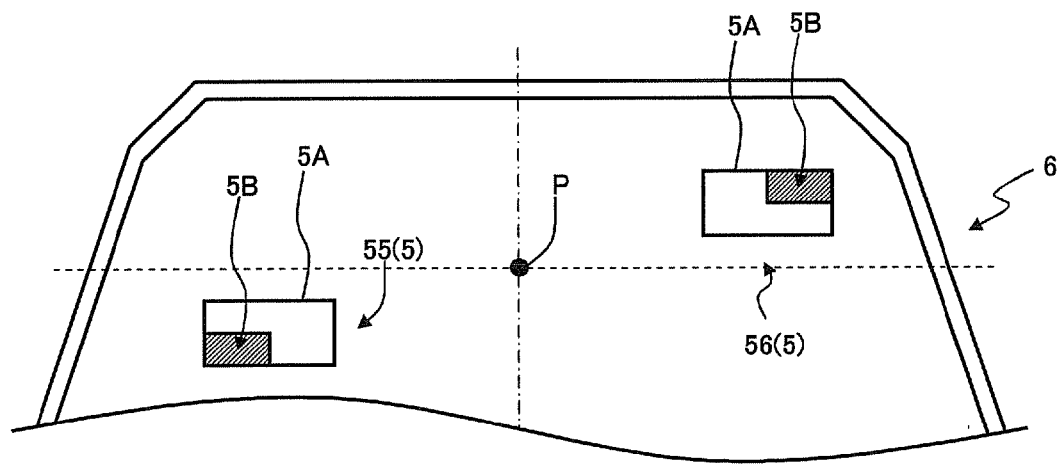
FIG. 19B is an illustration showing a configuration in which antennas having a point-symmetric shape are arranged point-symmetrically on a windshield glass of a vehicle.

FIG. 19B shows an example where antennas 55 and 56 having point-symmetric shapes and equal dielectric constants are arranged on the windshield glass 6 in a point-symmetric manner.

Figure 19C:
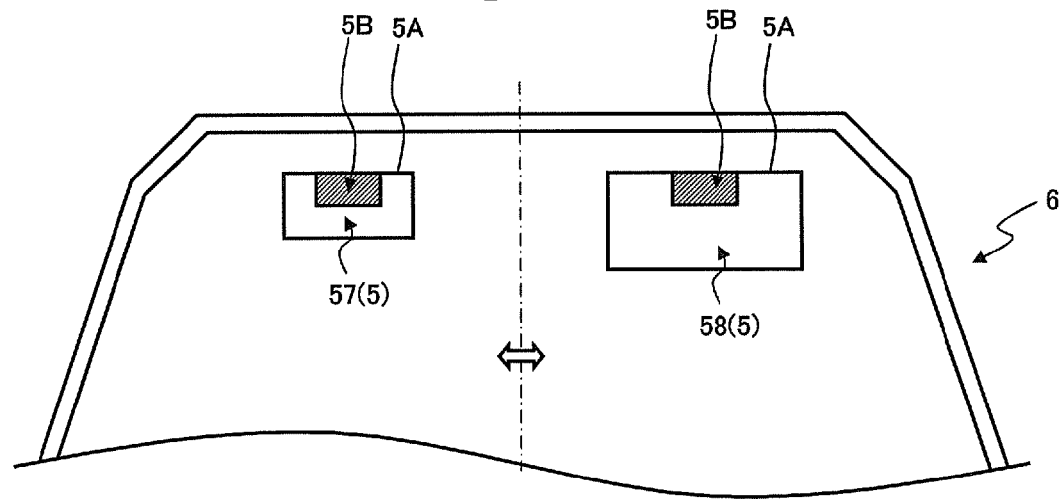
FIG. 19C is an illustration showing a configuration in which similarly shaped antennas are arranged axisymmetrically on a windshield glass of a vehicle.

FIG. 19C shows an example where antennas 57 and 58 having similar shapes and different dielectric constants are arranged on the windshield glass 6 in a line-symmetric manner.

In FIGS. 19A and 19C, a centerline of horizontal direction of the windshield glass 6 (indicated by a chain line in the figures) is a reference line of line symmetry. In FIG. 19B, an intersection point P of the centerline of the horizontal direction of the windshield glass and a centerline of vertical direction (indicated by a dashed line in the figure) is a reference point of point symmetry.

FIG. 19C shows an example in which antennas 5 having different sizes can be used insofar as they have equal frequency characteristics. The dielectric constant, which determines the frequency characteristics of antennas, is controlled by a dielectric constant of a substance that supports the antenna 5. In order to downsize an antenna while maintaining a same frequency characteristic, a substance that adjusts the dielectric constant may be included between the antenna and the glass.

Supporting the antenna on ceramics or the like with higher dielectric constant than that of the glass reduces the antenna size without changing the frequency characteristic.

In FIG. 19C, for example, an antenna 58 is attached to a glass having a dielectric constant of $\varepsilon_1=3$, and an antenna 57 is attached to the glass across a ceramic having a dielectric constant of $\varepsilon_2=30$. A similarity ratio R for downsizing without changing the frequency characteristic is determined by (Formula 3).

$$R = \frac{1}{\sqrt{\varepsilon_2/\varepsilon_1}} = \frac{1}{\sqrt{10}} \qquad \text{(Formula 3)}$$

As exemplified in FIG. 19A, FIG. 19B, and FIG. 19C, arrangement of a plurality of antennas 5 realizes antenna devices having identical impedance matching circuits 22.

A third embodiment will be described below.

The third embodiment relates to a receiving device suitable for receiving digital terrestrial TV broadcasting of frequency bands from 470 to 770 MHz. A basic configuration of the receiving device is as described above.

That is, similar to FIG. 3, the receiving device includes an antenna device 20 and a demodulating device 3 that are connected to one another through a single feeder cable 4.

Figure 20:
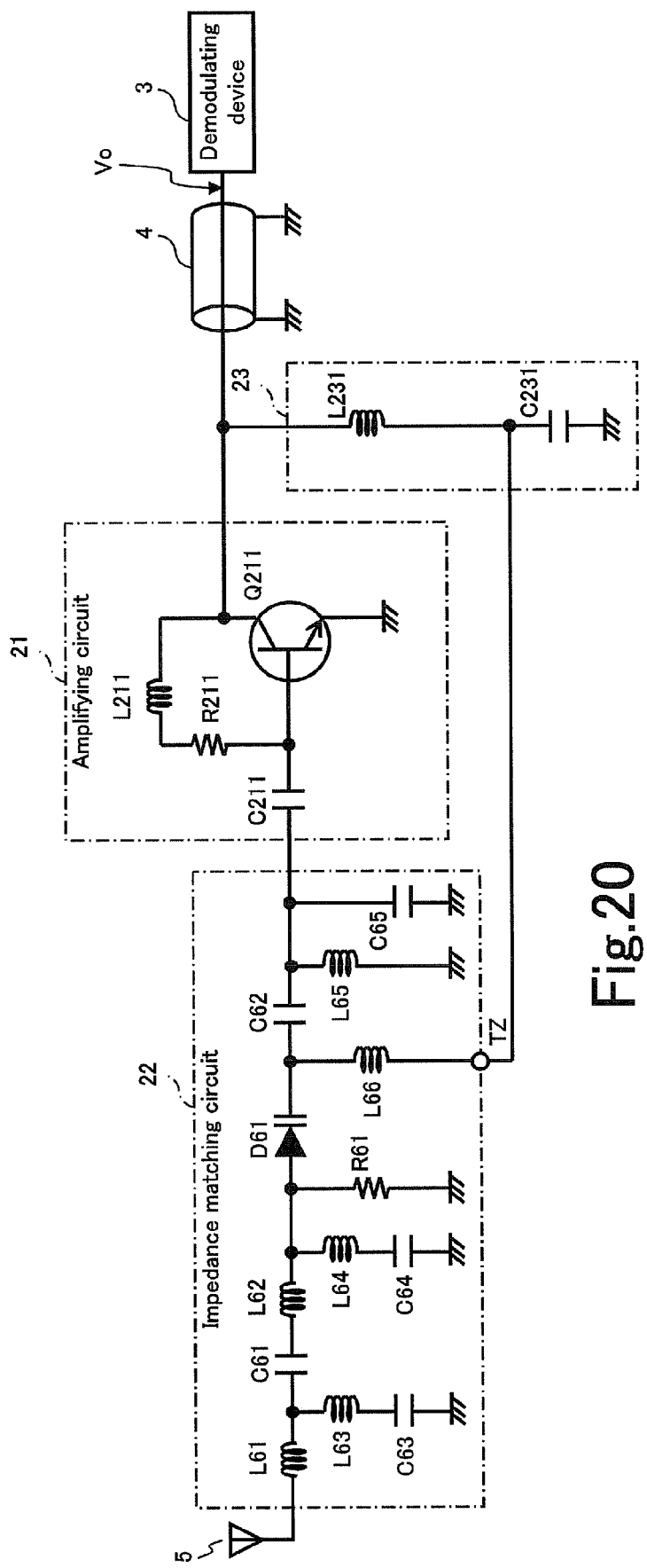
FIG. 20 is a circuit diagram of an antenna device according to a third embodiment.

FIG. 20 shows a circuit configuration of the antenna device 20 to be connected to a loop antenna. The antenna device 20 includes an impedance matching circuit 22, an amplifying circuit 21, and a low pass filter 23.

The impedance matching circuit 22 includes reactance adjustment capacitors C61 and C62, a variable-capacitance diode D61, and coils L61 and L62, all of which are connected in series to the antenna 5.

A series circuit of a coil L63 and a capacitor C63 is connected between a connecting point of the coil L61 and the capacitor C61 and an earth, while a series circuit of a coil L64 and a capacitor, and a resistor R61 are connected between a connecting point of the coil L62 and the variable-capacitance diode D61 and the earth.

A coil L65 and a capacitor C65 are connected between a connecting point of the capacitor C62 and the amplifying circuit and the earth, a chalk coil L66 for removing high frequency components is connected to a connecting point of the variable-capacitance diode D61 and the capacitor C62, and the other end of the chalk coil L66 is connected to an impedance adjusting terminal TZ.

A large value is set for a resistance value of the resistor R61 to limit the current through the variable-capacitance diode D61.

Impedances of the antennas 5 and the amplifying circuit 21 are matched by changing the capacity of the variable-capacitance diode D61 by a DC control voltage Vo to be applied to the impedance adjusting terminal TZ.

Figure 21:
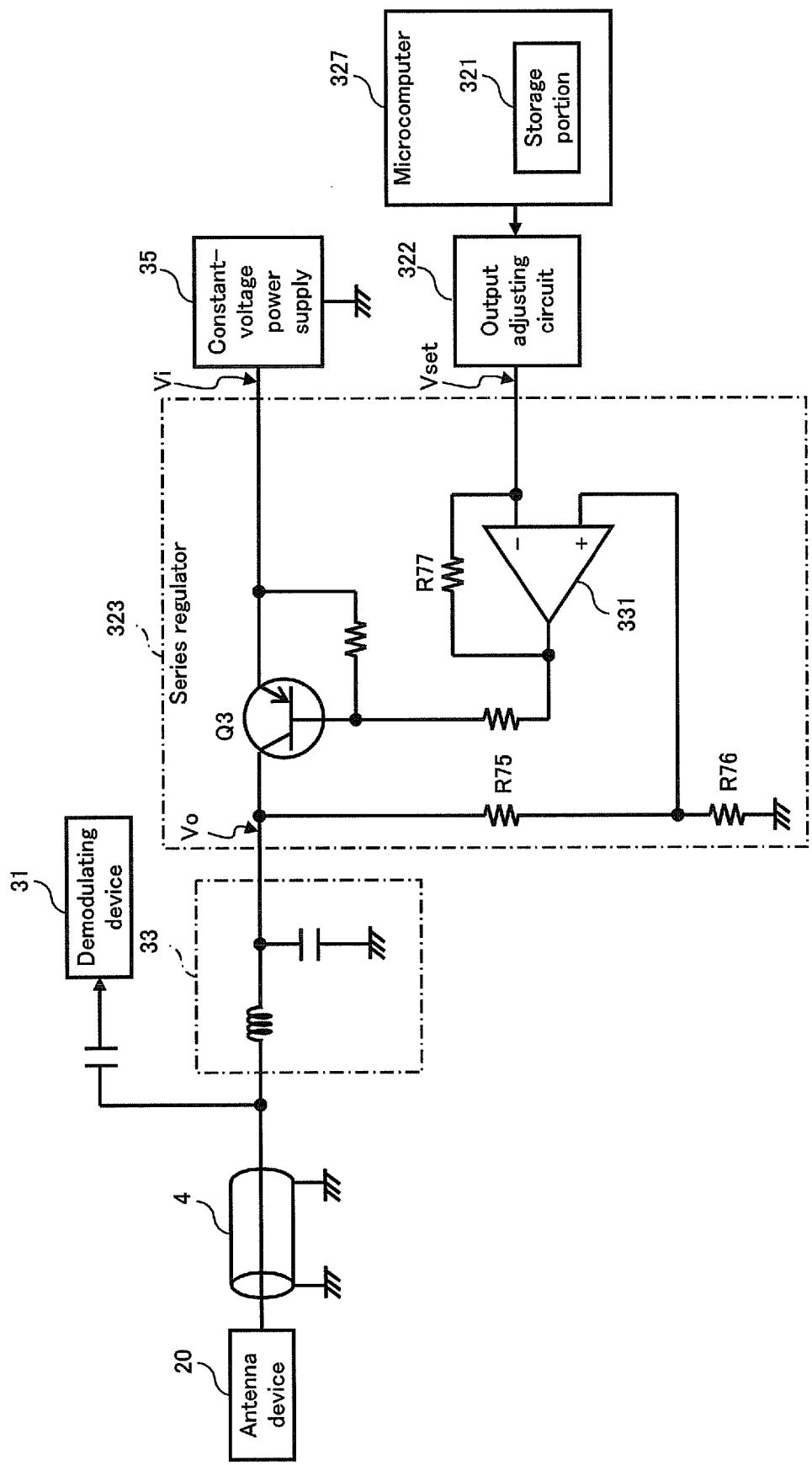
FIG. 21 is a circuit diagram of a demodulating device.

Referring to FIG. 21, the control voltage generating circuit 320 is formed of a microcomputer 327, an output adjusting circuit 322, and a series regulator 323.

Control information for adjusting a frequency characteristic of the impedance matching circuit 22 within an allowable range is stored in a storage portion 321 (formed of a ROM, an EEPROM, a RAM, or the like) of the microcomputer 327.

FIG. 22A shows a setting table as the control information stored in the storage portion 321. The control information, as used herein, refers to a logical value (indicated as "H" or "L" in FIG. 22A) of a control signal to be communicated from a pair of output ports P1 and P2 of the microcomputer 327 to the output adjusting circuit 322 so that the DC control voltage Vo is generated by the series regulator 323.

The setting table is a data table for generating an optimum DC control voltage that can adjust a frequency characteristic of the impedance matching circuit 22 within the above-described allowable range corresponding to a received frequency.

Referring to FIG. 22B, the optimum DC control voltage is a value resulting from adding a predetermined control voltage for the impedance matching circuit 22 to a minimum level of a voltage value capable of driving the amplifying circuit 21 of the antenna device 20.

The characteristic shown in FIG. 22B is a characteristic in the case where the impedance matching circuit 22 shown in FIG. 20 carries out impedance matching with respect to the digital terrestrial TV broadcasting of frequency bands from 470 to 770 MHz in Japan. The setting table will set appropriately according to the frequency band or the configuration of the impedance matching circuit.

It should be noted that the specific data in the setting table in FIG. 22A are shown for exemplary purposes, and not values set based on the frequency characteristic of the optimum DC control voltage shown in FIG. 22B.

The control voltage generating circuit 320 divides the optimum DC control voltages for the received frequencies into a plurality of groups, and generates a DC control value on a group basis, with a certain value as a representative value.

When the frequency characteristic of the optimum DC control voltage shown in FIG. 22B is divided into areas by a predetermined voltage pitch, the optimum DC control voltages corresponding to the received frequencies are distributed intensively in certain areas, as shown in FIG. 22C.

In FIG. 22C, the optimum DC control voltages corresponding to the received frequencies are distributed in four areas of E1, E2, E3, and E4, and not distributed in other areas E5, E6, and E7. The areas E5, E6, and E7 are where the optimum DC control voltage drastically fluctuates and the received frequencies rarely exist.

In view of this, the optimum DC control voltages distributed in the divided areas E1, E2, E3, E4 are grouped, and the optimum DC control voltages included in the groups are each rounded off by a representative value.

Examples of the representative value include an average value of the optimum DC control voltages that belong to each area, and an intermediate value between a minimum value and a maximum value of the optimum DC control voltages that belong to each area.

If the representative values of the divided areas E1, E2, E3, and E4 are set as DC control voltages V1, V2, V3, and V4, the DC control voltage can be selected by 2 bits.

Columns P1 and P2 of the setting table shown in FIG. 22A store 2-bit data for specifying the four types of DC control voltages V1, V2, V3, and V4.

Figure 23:
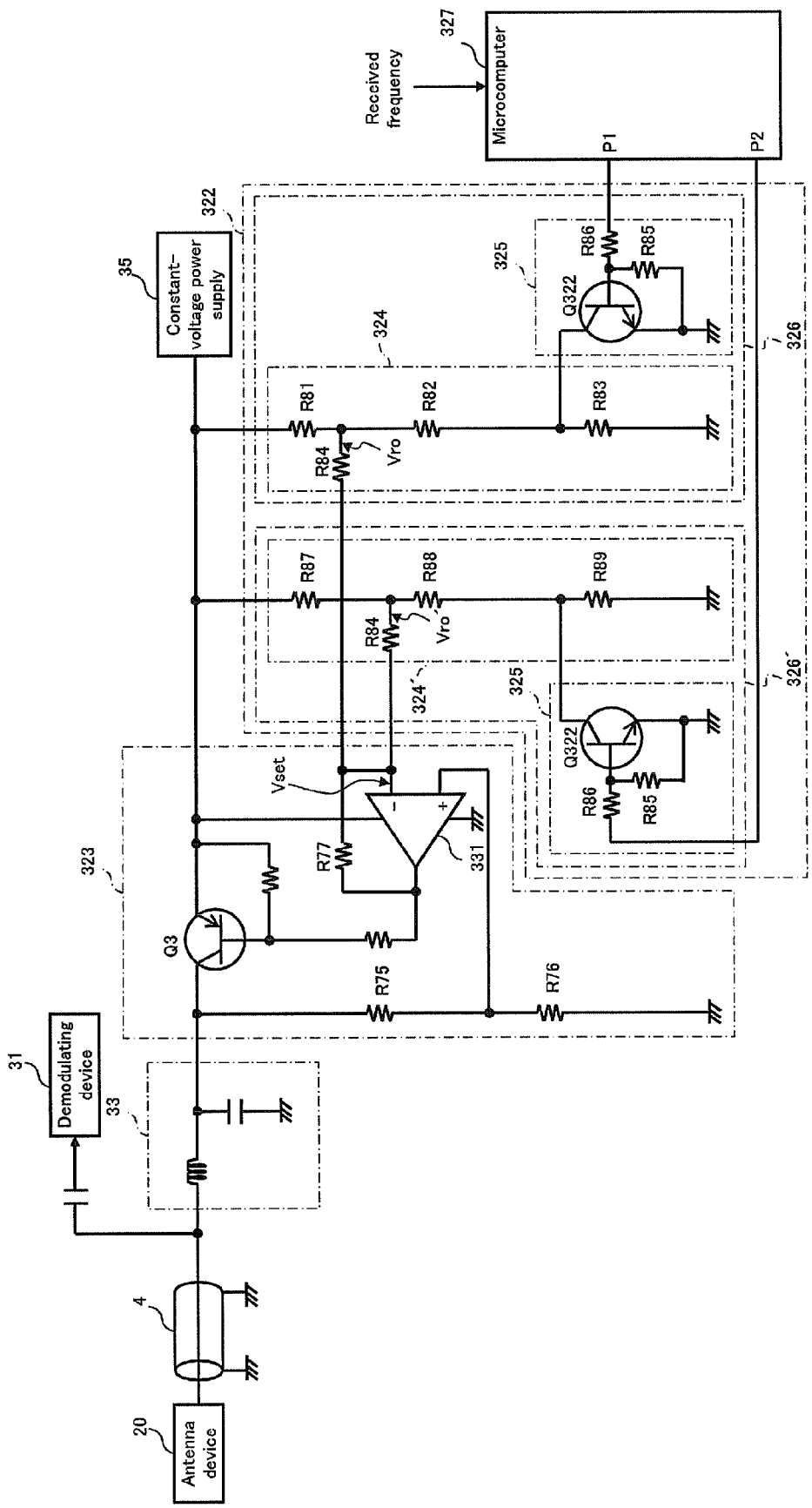
FIG. 23 is a circuit diagram of a demodulating device including an internal circuit of a voltage dividing circuit.

Referring to FIG. 23, the output adjusting circuit 322 includes voltage dividing circuits 326 and 326' including resistance circuits 324 and 324' that are connected in series between an output terminal of the constant-voltage power supply 35 and the earth and a switch element 325 for changing a voltage dividing ratio of the resistance circuits 324 and 324' on the basis of the control information.

The resistance circuit 324 includes a plurality of resistors R81 to R83 that are connected in series between the constant-voltage power supply 35 and a ground, and a resistor R84 that is connected to the resistors R81 and R82 at one end and to the series regulator 323 at the other end.

The resistance circuit 324' includes a plurality of resistors R87 to R89 that are connected in series between the constant-voltage power supply 35 and the ground, and the resistor R84 that is connected to resistors R87 and R88 at one end and to the series regulator 323 at the other end.

A pair of npn type transistors Q322 is used for the switch element 325. A collector of one transistor Q322 is connected to a node of the resistors R82 and R83, and a base is connected to an output port P1 of the microcomputer 327. A collector of the other transistor Q322 is connected to a node of resistors R88 and R89, and a base is connected to an output port P2 of the microcomputer 327.

The pair of the transistors Q322 are driven on the basis of signals to be output from the output ports P1 and P2 of the microcomputer 327, and thus output voltages Vro and Vro' of the voltage dividing circuits 326 and 326' change.

An output voltage Vset of the output adjusting circuit 322 is determined on the basis of the output voltages Vro and Vro' of the voltage dividing circuits 326 and 326', the resistor R84, the resistor R77, and the like.

When a DC control voltage is a four-value voltage, the output adjusting circuit may be formed of two voltage dividing circuits, while when the DC control voltage is an eight-value voltage, the output adjusting circuit may be formed of three voltage dividing circuits. A DC control voltage of $2^N$ value can be generated by adding N voltage dividing circuits.

Figure 24:
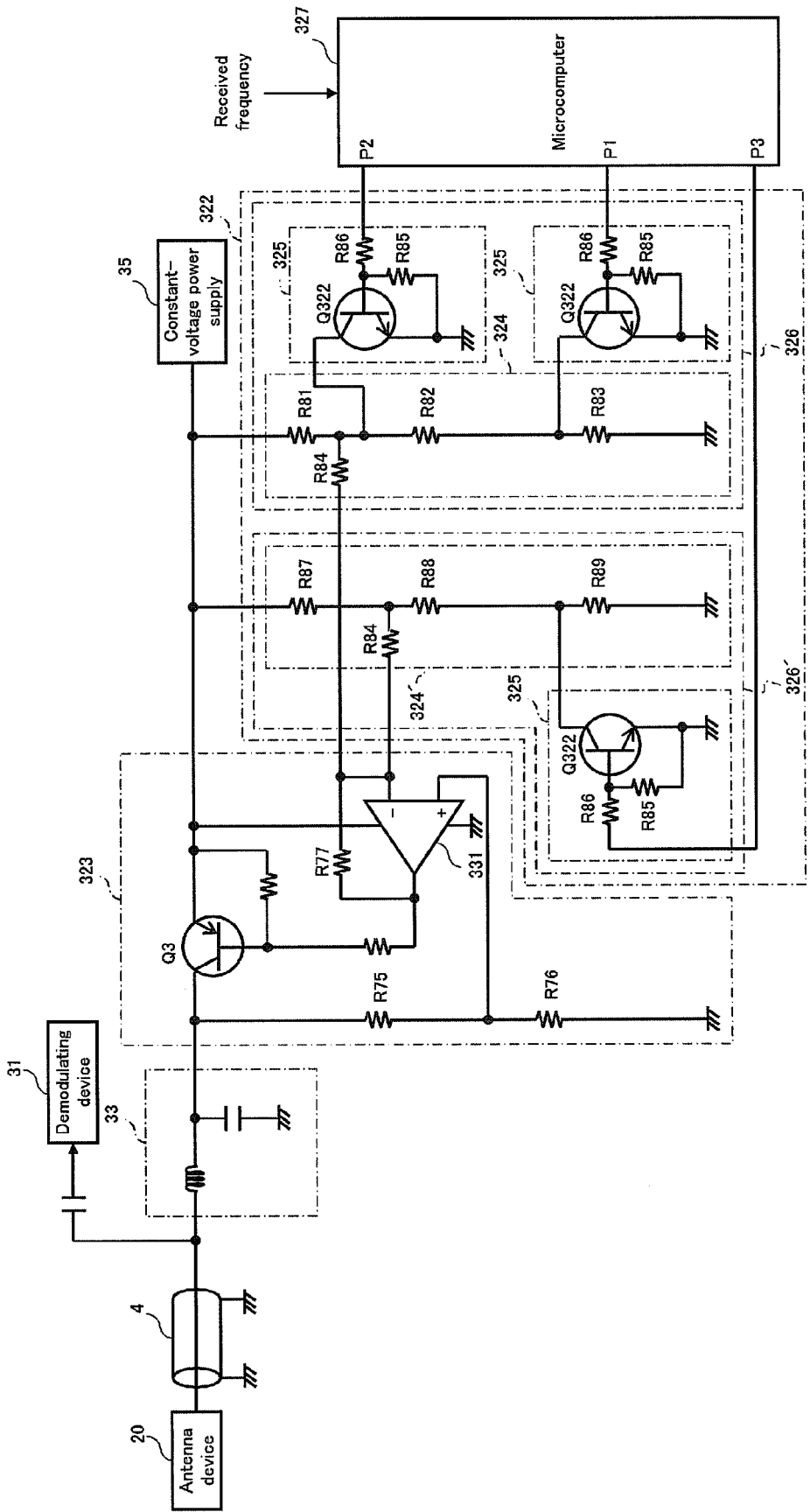
FIG. 24 is a circuit diagram of a voltage dividing circuit in which two switch elements are connected to one resistance circuit.

FIG. 24 shows another configuration example of the voltage dividing circuit 326. Two switch elements 325 are connected to one resistance circuit 324. In this case, a DC control voltage of six-value is generated.

The series regulator 323 generates a DC control voltage Vo on the basis of an output voltage Vset of the output adjusting circuit 322.

The impedance matching circuit 22 to be incorporated in the antenna device 20 is not limited to the configuration shown in FIG. 20, and any of the other impedance matching circuits 22 described above may be adopted depending on the frequency band of the broadcasting wave.

A fourth embodiment will be described below. The fourth embodiment is an example of combining the second embodiment and the third embodiment.

Figure 25:
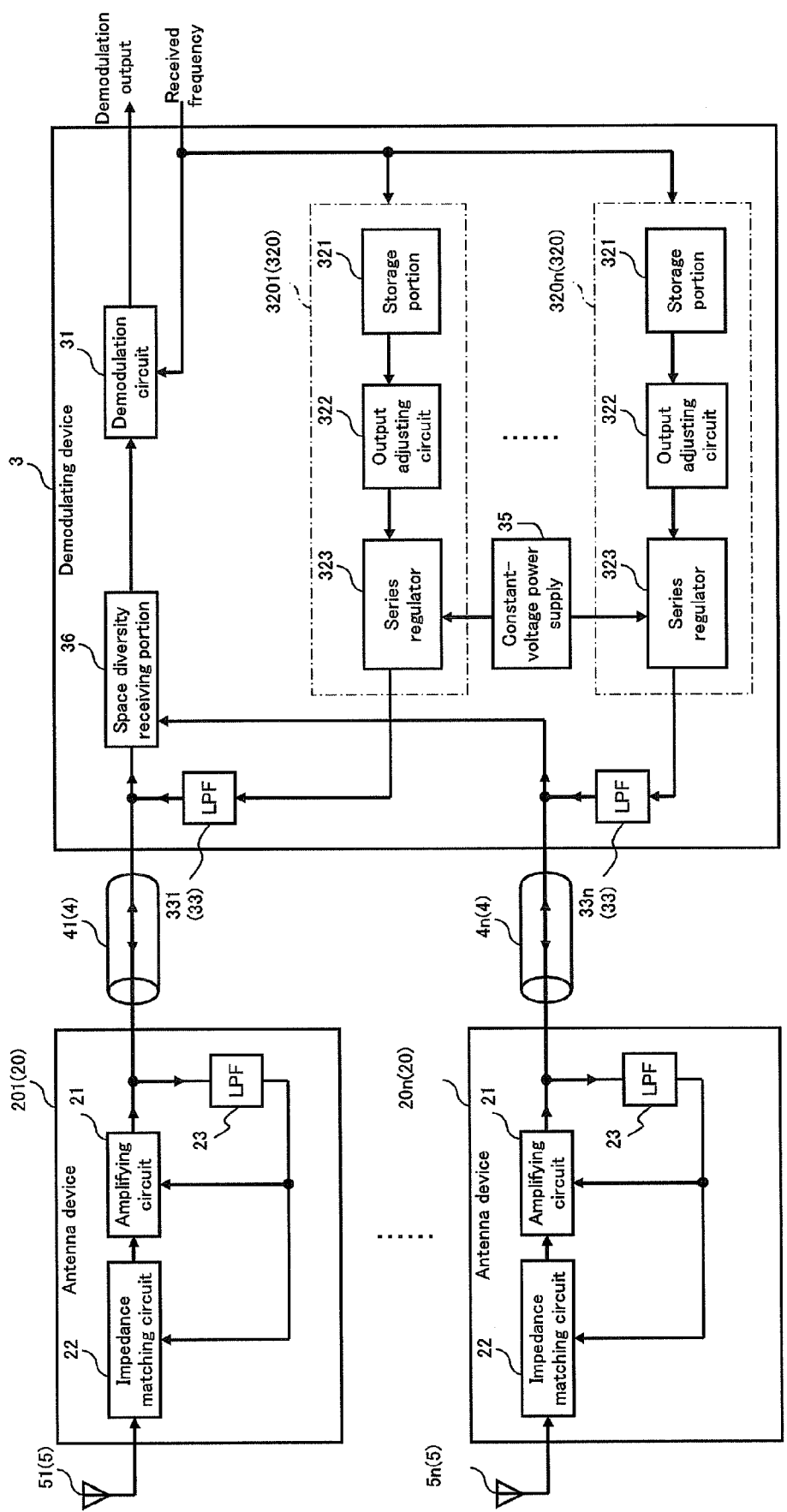
FIG. 25 is a block configuration diagram of a receiving device including a plurality of antenna devices.

Referring to FIG. 25, the demodulating device 3 includes a space diversity receiving portion 36, a demodulation circuit 31, and control voltage generating circuits 320 (3201 to 320n).

As described above, the control voltage generating circuits 320 are each configured to divide optimum DC control voltages for received frequencies into a plurality of groups, and generate a DC control voltage as a representative value on a group basis.

A configuration shown in FIG. 18B can be adopted as a modification example of the demodulating device 3.

While the details of the embodiments of the present invention are as described above, the following modification examples may also be employed.

While in the above embodiments description is made of a receiving device to which the antenna device 2 and the demodulating device 3 according to the present invention, which are incorporated in a vehicle, are connected to one another through the feeder cable 4, such a receiving device is also possible that the antenna device 2 and the demodulating device 3 are incorporated in a vehicle other than the vehicle, such as an airplane and a ship.

The present invention is also applicable to such a receiving device that incorporates a radio tuner or a television tuner and is incorporated into an audio device at home or in an office, and that the antenna device 2 and the demodulating device 3 are installed in separated positions and connected to one another through a feeder cable.

While in the above embodiments description is made of the case where the amplifying circuit 21 to be incorporated into the antenna device is formed of an npn type bipolar transistor, the amplifying circuit 21 may be formed of a pnp type bipolar transistor or a field-effect transistor.

Figure 14:
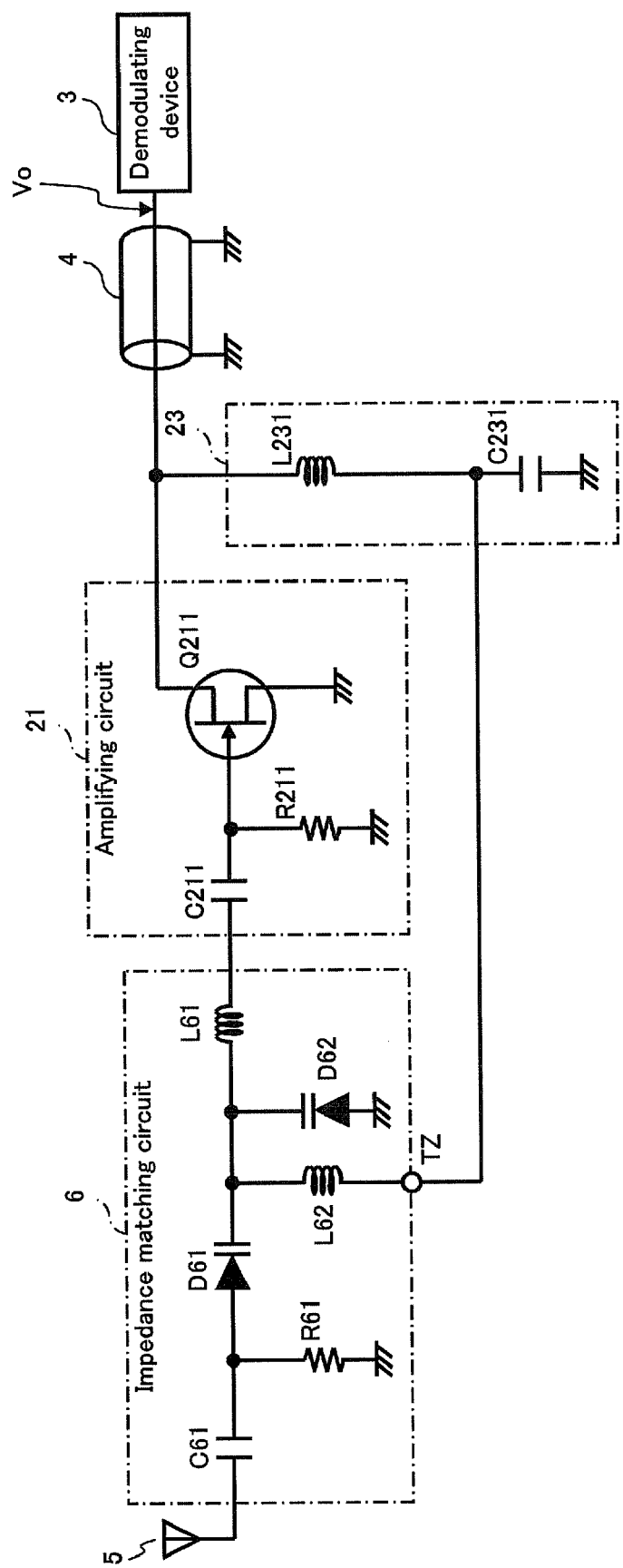
FIG. 14 is a circuit diagram in a case where an FET is used for an amplifying circuit in the first example of the antenna device.

It should be noted that if a transistor other than the npn type bipolar transistor is used as the transistor Q211, a specific circuit configuration embodying the present invention changes depending on the employed transistor. For example, if an FET is used as the transistor Q211 of the amplifying circuit 21 in the circuit shown in FIG. 6, the circuit configuration will be as shown in FIG. 14.

The above embodiments are provided for exemplary purposes only, and a specific configuration or the like of each block may be changed and designed within the scope of the present invention.

What is claimed is:

1. An antenna device that is placed adjacent to an antenna for receiving a high frequency signal and transmits the high frequency signal received by the antenna to a demodulating device through a feeder cable, the antenna device comprising:
    an amplifying circuit for amplifying the high frequency signal received by the antenna;
    an impedance matching circuit for matching impedances of the antenna and the amplifying circuit according to a received frequency;
    a low pass filter for receiving a DC control voltage to be supplied from the demodulating device through the feeder cable, the DC control voltage adjusting a frequency characteristic of the impedance matching circuit within an allowable range corresponding to the received frequency, and for supplying the DC control voltage to the amplifying circuit and the impedance matching circuit after removing a high frequency component from the DC control voltage; and
    a first clamping circuit for clamping the DC control voltage to a constant voltage,
    wherein a difference voltage of the DC control voltage and a clamp voltage by the first clamping circuit adjusts a reactance value of at least one variable reactive element incorporated in the impedance matching circuit.

2. The antenna device according to claim 1, further comprising a second clamping circuit for clamping the DC control voltage to a constant voltage,
    wherein a clamp voltage by the second clamping circuit is applied as a supply voltage to the amplifying circuit.

3. The antenna device according to claim 1, further comprising a third clamping circuit for clamping the DC control voltage to a constant voltage,
    wherein the DC control voltage is applied as a supply voltage to the amplifying circuit, and a clamp voltage by the third clamping circuit is applied as an input bias voltage of the amplifying circuit.

4. The antenna device according to claim 2, wherein the first clamping circuit also serves as the second clamping circuit.

5. The antenna device according to claim 3, wherein the first clamping circuit also serves as the third clamping circuit.

6. The antenna device according to claim 1, wherein the amplifying circuit is composed of an amplifying element including a current feedback bias circuit, and the first clamping circuit is connected in parallel to a feedback resistance.

7. A demodulating device for demodulating a high frequency signal to be transmitted through a feeder cable from an antenna device placed adjacent to an antenna for receiving the high frequency signal, the demodulating device comprising:
    a demodulation circuit for demodulating the high frequency signal transmitted through the feeder cable from the antenna device; and
    a control voltage generating circuit for generating a DC control voltage to be supplied to an impedance matching circuit and amplifying circuit that are incorporated in the antenna device, the DC control voltage adjusting a frequency characteristic of the impedance matching circuit within an allowable range corresponding to a received frequency, and for outputting the generated DC control voltage to the feeder cable,
    wherein the control voltage generating circuit includes:
        a storage portion storing a plurality of control values for adjusting the frequency characteristic of the impedance matching circuit within the allowable range corresponding to the received frequency;
        a DA converter for reading control data corresponding to the received frequency from the storage portion and generating a DC voltage corresponding to the control data; and
        a series regulator for generating the DC control voltage on the basis of an output voltage of the DA converter.

8. The demodulating device according to claim 7, wherein for the series regulator, a feedback voltage is set so that a voltage value equal to or greater than a minimum level capable of driving the amplifying circuit is output.

9. An antenna device to be connected through a feeder cable to the demodulating device according to claim 7, wherein
    a plurality of antenna devices are configured to connect to the demodulating device through the feeder cable and each of the antenna devices is connected to one of a plurality of antennas having an identical shape or a symmetrical shape and an equal dielectric constant or one of a plurality of antennas having a similar shape and a different dielectric constant with an equal frequency characteristic.

10. A demodulating device for demodulating a high frequency signal to be transmitted through a feeder cable from an antenna device placed adjacent to an antenna for receiving the high frequency signal, the demodulating device comprising:
    a demodulation circuit for demodulating the high frequency signal transmitted through the feeder cable from the antenna device; and
    a control voltage generating circuit for generating a DC control voltage to be supplied to an impedance matching circuit and an amplifying circuit that are incorporated in the antenna device, the DC control voltage adjusting a frequency characteristic of the impedance matching circuit within an allowable range corresponding to a received frequency, and for outputting the generated DC control voltage to the feeder cable,
    wherein the control voltage generating circuit divides an optimum DC control voltage for the received frequency into a plurality of groups, and generates the DC control voltage with a certain value as a representative value on a group basis.

11. The demodulating device according to claim 10, wherein the control voltage generating circuit includes:
    a series regulator for generating the DC control voltage on the basis of an input voltage;
    a storage portion storing a plurality of pieces of control information for adjusting the frequency characteristic of the impedance matching circuit within an allowable range corresponding to the received frequency; and
    an output adjusting circuit for generating an output voltage to the series regulator on the basis of the control information.

12. The demodulating device according to claim 11, wherein:
    the output adjusting circuit is composed of a resistance circuit composed of a plurality of resistances connected in series between a constant-voltage power supply and a ground, and a plurality of voltage dividing circuits each including a switch element for changing a voltage dividing ratio of the resistance circuit on the basis of the control information; and the output adjusting circuit generates a DC voltage based on a voltage dividing ratio of each voltage dividing circuit.

13. A demodulating device for demodulating a high frequency signal to be transmitted through a feeder cable from an antenna device placed adjacent to an antenna for receiving the high frequency signal, the demodulating device comprising:

a demodulation circuit for demodulating the high frequency signal transmitted through the feeder cable from the antenna device;

a control voltage generating circuit for generating a DC control voltage to be supplied to an impedance matching circuit and an amplifying circuit that are incorporated in the antenna device, the DC control voltage adjusting a frequency characteristic of the impedance matching circuit within an allowable range corresponding to a received frequency, and for outputting the generated DC control voltage to the feeder cable; and a space diversity receiving portion that selects or synthesizes any of high frequency signals transmitted through feeder cables from a plurality of antenna devices placed adjacent to a plurality of antennas, wherein:

the demodulation circuit demodulates the high frequency signals selected or synthesized by the space diversity receiving portion; and the control voltage generating circuit generates a DC control voltage to be supplied to the impedance matching circuit and the amplifying circuit incorporated in each antenna device, the DC control voltage adjusting the frequency characteristic of the impedance matching circuit corresponding to the received frequency within an allowable range, and outputs the generated DC control voltage to each feeder cable.

14. The demodulating device according to claim 13, wherein the control voltage generating circuit divides an optimum DC control voltage for the received frequency into a plurality of groups and generates the DC control voltage as a representative value on a group basis.

15. The demodulating device according to claim 13, further comprising a plurality of control voltage generating circuits corresponding to the antenna devices.

16. The demodulating device according to claim 13, wherein at least one control voltage generating circuit is shared by the plurality of antenna devices.

* * * * *